United States Patent
Mathieu

(10) Patent No.: US 7,444,253 B2
(45) Date of Patent: Oct. 28, 2008

(54) AIR BRIDGE STRUCTURES AND METHODS OF MAKING AND USING AIR BRIDGE STRUCTURES

(75) Inventor: Gaetan L. Mathieu, Varennes (CA)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/382,458

(22) Filed: May 9, 2006

(65) Prior Publication Data

US 2007/0265795 A1 Nov. 15, 2007

(51) Int. Cl.
*H01L 21/288* (2006.01)
*H01L 21/283* (2006.01)
*H01L 21/28* (2006.01)
*H01L 21/20* (2006.01)
*H01L 23/522* (2006.01)
*H01L 23/00* (2006.01)
*H01L 23/36* (2006.01)
*H01L 23/485* (2006.01)
*H01L 27/00* (2006.01)

(52) U.S. Cl. ............... 702/108; 257/E21.573; 257/E23.17; 257/E23.169; 324/763; 702/57; 702/117

(58) Field of Classification Search ............... 73/865.9; 257/E21.573, E23.169, E23.17; 324/500, 324/509, 512, 513, 515, 522, 523, 527, 537, 324/754, 755, 763; 702/57, 58, 108, 117, 702/118

See application file for complete search history.

(56) References Cited

U.S. PATENT DOCUMENTS

| | | | | |
|---|---|---|---|---|
| 2,851,660 A | * | 9/1958 | Tobin et al. | 324/527 |
| 2,877,544 A | | 3/1959 | Gammel | 29/833 |
| 2,954,521 A | * | 9/1960 | McKee | 324/72.5 |
| 3,082,374 A | * | 3/1963 | Buuck | 324/73.1 |
| 3,567,914 A | * | 3/1971 | Neese et al. | 716/15 |
| 4,761,303 A | * | 8/1988 | Ruszczyk et al. | 430/314 |
| 4,920,639 A | | 5/1990 | Yee | |
| 5,476,211 A | * | 12/1995 | Khandros | 228/180.5 |
| 5,529,634 A | * | 6/1996 | Miyata et al. | 118/726 |
| 5,839,188 A | * | 11/1998 | Pommer | 29/830 |
| 5,869,354 A | * | 2/1999 | Leedy | 438/110 |
| 5,917,707 A | * | 6/1999 | Khandros et al. | 361/776 |
| 5,974,662 A | * | 11/1999 | Eldridge et al. | 29/842 |

(Continued)

FOREIGN PATENT DOCUMENTS

JP 2004-165310 A * 6/2004

OTHER PUBLICATIONS

IBM Technical Disclosure Bulletin: "Intertwined Integrated Circuit Testing Chain", Feb. 1, 1986, vol. 28, No. 9, pp. 3959-3960.*
"ProMetal 3-D Printing Process," ProMetal division of The Ex One Company (Irwin, Pennsylvania), 2 pages, date of first publication unknown, submitted pages printed from .prometal.com/process.html on Apr. 20, 2006.
"ProMetal Equipment," ProMetal division of The Ex One Company (Irwin, Pennsylvania), 2 pages, date of first publication unknown, submitted pages printed from .prometal.com/equipment.html on Apr. 20, 2006.
"Welcome to the ink-jet age" ZDNet.co.uk of CNET Networks, 5 pages, submitted pages printed from news.zdnet.co.uk.

(Continued)

*Primary Examiner*—Edward R Cosimano
(74) *Attorney, Agent, or Firm*—N. Kenneth Burraston

(57) ABSTRACT

A probe card assembly, according to some embodiments of the invention, can comprise a tester interface configured to make electrical connections with a test controller, a plurality of electrically conductive probes disposed to contact terminals of an electronic device to be tested, and a plurality of electrically conductive data paths connecting the tester interface and the probes. At least one of the data paths can comprise an air bridge structure trace comprising an electrically conductive trace spaced away from an electrically conductive plate by a plurality of pylons.

11 Claims, 27 Drawing Sheets

U.S. PATENT DOCUMENTS

| | | | |
|---|---|---|---|
| 5,994,152 A * | 11/1999 | Khandros et al. | 438/617 |
| 6,033,935 A * | 3/2000 | Dozier et al. | 438/117 |
| 6,221,750 B1 * | 4/2001 | Fjelstad | 438/611 |
| 6,246,014 B1 * | 6/2001 | Pommer | 174/261 |
| 6,255,126 B1 * | 7/2001 | Mathieu et al. | 438/15 |
| 6,336,269 B1 * | 1/2002 | Eldridge et al. | 29/885 |
| 6,441,315 B1 * | 8/2002 | Eldridge et al. | 174/260 |
| 6,509,751 B1 * | 1/2003 | Mathieu et al. | 324/754 |
| 6,605,825 B1 | 8/2003 | Brar et al. | |
| 6,640,432 B1 * | 11/2003 | Mathieu et al. | 29/842 |
| 6,827,584 B2 * | 12/2004 | Mathieu et al. | 439/66 |
| 6,849,308 B1 | 2/2005 | Speakman et al. | |
| 6,945,827 B2 * | 9/2005 | Grube et al. | 439/700 |
| 7,223,696 B2 * | 5/2007 | Leedy | 438/690 |
| 7,242,012 B2 * | 7/2007 | Leedy | 250/492.1 |
| 2001/0012739 A1 * | 8/2001 | Grube et al. | 439/862 |
| 2001/0044225 A1 * | 11/2001 | Eldridge et al. | 439/66 |
| 2003/0151046 A1 | 8/2003 | Brar et al. | |
| 2004/0016119 A1 * | 1/2004 | Eldridge et al. | 29/884 |
| 2005/0089635 A1 * | 4/2005 | Hasei | 427/256 |
| 2007/0141743 A1 | 6/2007 | Mathieu et al. | |
| 2008/0088010 A1 | 4/2008 | Hobbs et al. | |

OTHER PUBLICATIONS

"Epson Inkjet Technology Used to Fabricate World's First Ultra-Thin Multilayer Circuit Board", News Release, Nov. 1, 2004, 2 pages, submitted pages printed from .epson.co.jp.

Butterfield, "The Print Shop: Sci-Fi Inkjet Printers" on-line article, Mar. 1, 2005, 2 pages, submitted pages printed from .pcworld.com.

Canny et al., "Flexonics," Electrical Engineering and Computer Sciences, University of California, Berkeley, pp. 1-17, Dec. 14-17, 2002.

Gay, "Direct Writing Global status and opportunties for the UK in advanced manufacturing," Crown, Feb. 2004, pp. i-vii and 1-1 through 6-1.

Graham-Rowe, "'Gadget printer' Promises industrial revolution," New Scientist, 2 pages, Jan. 2003.

Lipson, "Homemade," IEEE Spectrum, pp. 24-31, May 2005.

Nozawa, "Epson Prints 20-Layer Board with Inkjet Technology" Feb. 2005, Nikkei Electronics Asia, Nikkei Business Publications, Inc., submitted pages printed from .techhon.nikkeibp.co.jp.

Wohlers, "A Year Filled With Promising R&D," Time-Compression. Technologies Magazine, 4 pages, Nov./Dec. 2002, Wohlers Associates.

* cited by examiner

AIR BRIDGE STRUCTURES AND METHODS OF MAKING AND USING AIR BRIDGE STRUCTURES

BACKGROUND

Various elements and structures have been used with electronic devices to provide electrical paths between connection elements on the devices. The present invention is directed to novel uses and applications of and improved processes for making air bridge structures configured to convey electrical signals on an electronic device.

SUMMARY

A probe card assembly, according to some embodiments of the invention, can comprise a tester interface configured to make electrical connections with a test controller, a plurality of electrically conductive probes disposed to contact terminals of an electronic device to be tested, and a plurality of electrically conductive data paths connecting the tester interface and the probes. At least one of the data paths can comprise an air bridge structure comprising an electrically conductive trace spaced away from an electrically conductive plate by a plurality of pylons.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for ease of illustration or clarity. In addition, as the term "on" is used herein, one object (e.g., a material, a layer, a substrate, etc.) can be "on" another object regardless of whether the one object is directly on the other object or there are one or more intervening objects between the one object and the other object. Also, directions (e.g., above, below, top, bottom, side, "x," "y," "z," etc.), if provided, are relative and provided solely by way of example and for ease of illustration and discussion and not by way of limitation.

Figure 1:
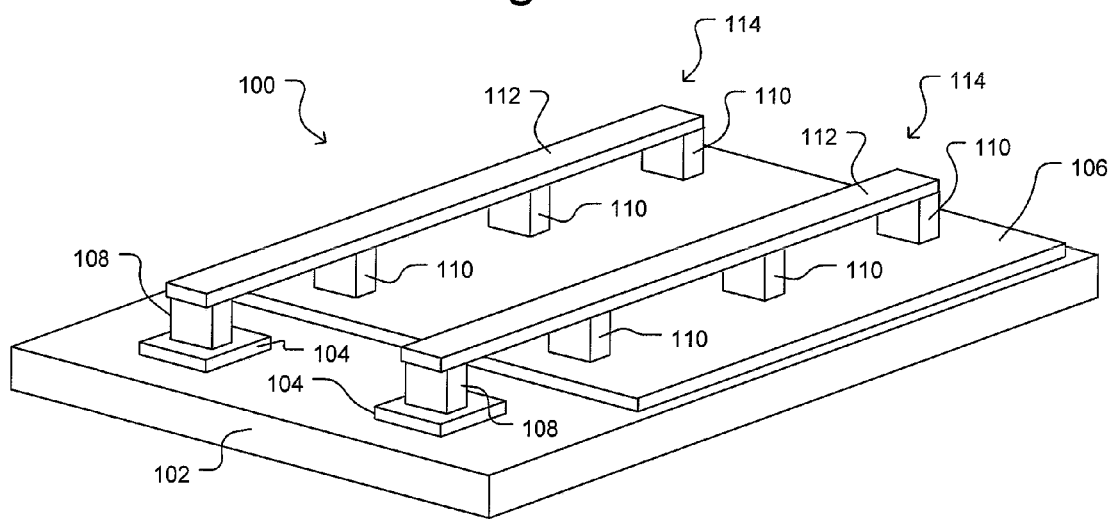
FIG. 1 illustrates an exemplary electronic device with exemplary air bridge structures according to some embodiments of the invention.

FIG. 1 illustrates a partial, perspective view of an exemplary electronic device 100 according to some embodiments of the invention. As shown, the electronic device 100 can include a plurality of electrically conductive terminals 104 (two are shown but more or fewer can be used) and a plurality of air bridge structures 114 (two are shown but more or fewer can be used). As shown, the electronic device 100 can also include a substrate 102 and an electrically conductive plate 106 (one is shown but more than one can be included). The electronic device 100 can be any type of electronic device. Non-limiting examples of the electronic device 100 include a semiconductor die, a probing device, a semiconductor package, a printed circuit board, any portion of a probe card assembly, etc.

The air bridge structures 114 can provide or can be part of electrical paths that interconnect elements (e.g., terminals, electrical components such as resistors, capacitors, integrated circuit chips, etc.) on the electronic device 100. In FIG. 1, each air bridge structure 114 is illustrated as connected at one end to one of the terminals 104. Although not shown in FIG. 1, each air bridge structure 114 can extend and be electrically connected to other terminals (e.g., like terminals 104) or elements on or in the substrate 102. In addition, the terminals 104 can be electrically connected through electrically conductive traces and/or vias (e.g., like 202 in FIG. 2B)) embedded within or on a surface of the substrate 102 to other terminals and/or elements (not shown) on or within the substrate 102.

As shown, each air bridge structure 114 can comprise an electrically conductive trace 112 disposed on a plurality of spaced apart pylons 108, 110. One or more of the pylons 108 can be electrically conductive and thus electrically connect the trace 112 to a connection element on or in the substrate 102. In the example shown in FIG. 1, a pylon 108 can be electrically conductive and thus electrically connect a trace 112 to one of the terminals 104, as shown in FIG. 1. In the example shown in FIG. 1, the pylons 110 can be electrically insulative and can comprise a dielectric material. These pylons 110 can support the trace 112 over the conductive plate 106 and electrically insulate the trace 112 from the plate 106.

The plate 106 can be electrically connected to ground or to a fixed or variable voltage source (not shown). As can be seen in FIG. 1, the pylons 110 can occupy only a small part of the space between each trace 112 and the plate 106. Ambient air can thus fill most of the space between each trace 112 and the plate 106. For example, depending on the size and number of pylons 110 disposed along a trace 112, the ratio of open space to space occupied by pylons 110 between a trace 112 and the plate 106 can be nearly any desired amount. For example, the percentage of the total area of a trace 112 that is disposed above the plate 106 for which there is open space (and thus ambient air as the dielectric material) between the trace 112 and the plate 106 can be sixty percent, seventy percent, eighty percent, ninety percent, ninety-five percent, or any percentage in between any of the foregoing percentages. Indeed, depending on the sizes and configurations of the trace 112 and the pylons 112 attached to the trace 112, the foregoing percentage can be less then sixty percent or greater than ninety-five percent.

As is known, ambient air is a near perfect dielectric. Consequently, there can be little—typically negligible—to no capacitance between a trace 112 and the plate 106 where air is the dielectric material between the trace 112 and the plate 106. Thus, the only appreciable capacitance between a trace 112 and the plate 106 can be due to the pylons 110. Because the pylons 110 can be made to occupy only a small part of the area of trace 112 (and thus occupy only a small portion of the space between a trace 112 and the plate 106) as discussed above, each bridge structure 114 can be made to have little—indeed, negligible—capacitive coupling with the plate 106.

As is known, the conductive plate 106 can prevent or substantially eliminate such things as cross-talk, capacitive coupling, and leakage current interactions between traces 112 and conductive traces, terminals, and/or other electronic elements (not shown) embedded within the substrate 102 or disposed on an opposite surface of the substrate 102. Thus, in the exemplary configuration shown in FIG. 1, the plate 106 can decouple the traces 112 of each air bridge structure 114 from unintended interaction (e.g., cross-talk, capacitive coupling, leakage current, etc.) with conductive traces and terminals and electronic elements located within the substrate 102 or disposed on an opposite surface of the substrate 102, and in addition, the air bridge structure 114 can effectively decouple the traces 112 from capacitive interaction with the plate 106.

FIGS. 2A-9B illustrate an exemplary process for making an electronic device with air bridge structures according to some embodiments of the invention. For purposes of illustration and discussion, the process illustrated in FIGS. 2A-9B will be described with respect to making the electronic device 100 of FIG. 1. Other and different electronic devices can, however, be made using the process illustrated in FIGS. 2A-9B.

Figure 2A:
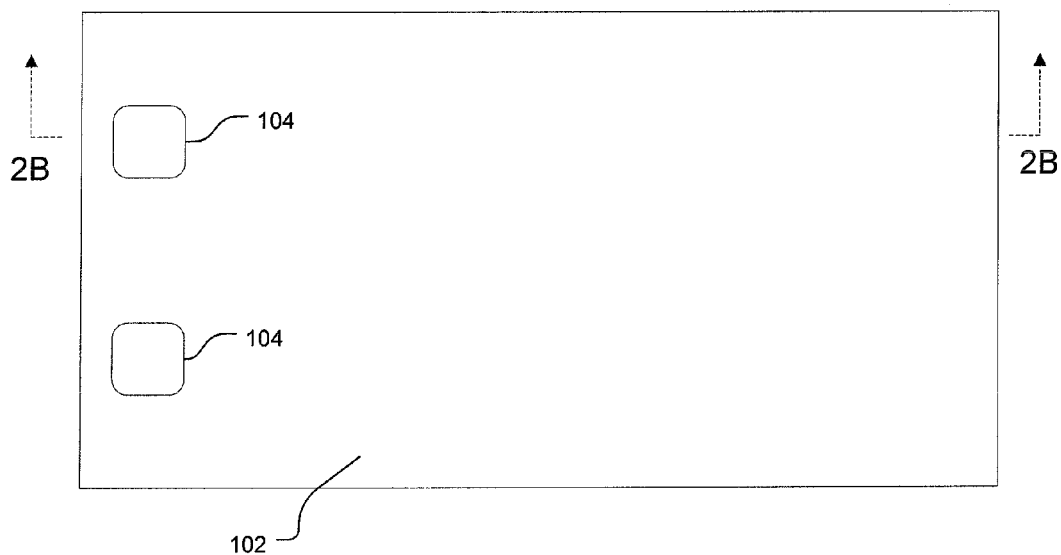
FIGS. 2A, 2B, 3A, 3B, 4A, 4B, 5A, 5B, 6A, 6B, 7A, 7B, 8A, 8B, 9A and 9B illustrate an exemplary process for making air bridge structures according to some embodiments of the invention.
Figure 2B:
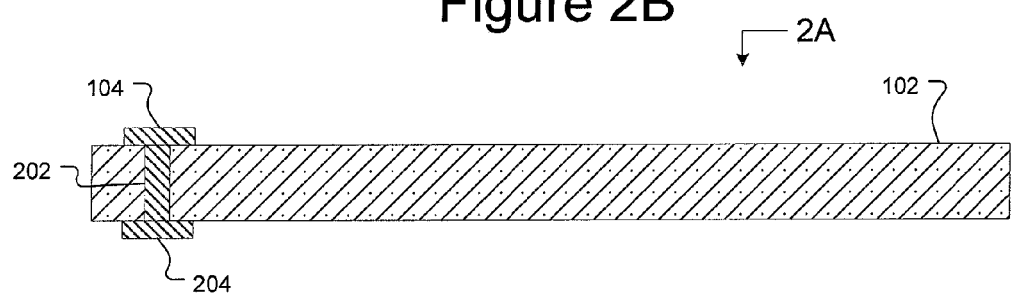

As shown in FIGS. 2A and 2B (FIG. 2A shows a top view, and FIG. 2B shows a side, cross-sectional view), the process illustrated in FIGS. 2A-9B can begin with the provision of the substrate 102. As shown in FIGS. 2A and 2B, a substrate 102 comprising a plurality of electrically conductive terminals 104 can be made or provided. (As mentioned above, although two terminals 104 are shown, more or fewer can be used.) As shown in FIG. 2B, each terminal 104 can be electrically connected by a conductive via 202 to another electrically conductive terminal 204 on an opposite side of the substrate 102. Alternatively, one or more of the terminals 104 can be electrically connected by vias and/or traces (not shown) on a surface of or embedded within the substrate 102 to terminals (e.g., like terminals 204) disposed in other locations on either side of the substrate 102). As yet another alternative, one or more of the terminals 104 can be electrically connected by vias and/or traces (not shown) to other types of terminals (not shown) or to electronic elements (e.g., resistors, capacitors, active electronic circuits such as processor circuits or memory circuits, etc.) on or within the substrate 102. The substrate 102 can be any type of substrate including without limitation a printed circuit board, a ceramic substrate, a semiconductor substrate or wafer, etc.

Figure 3A:
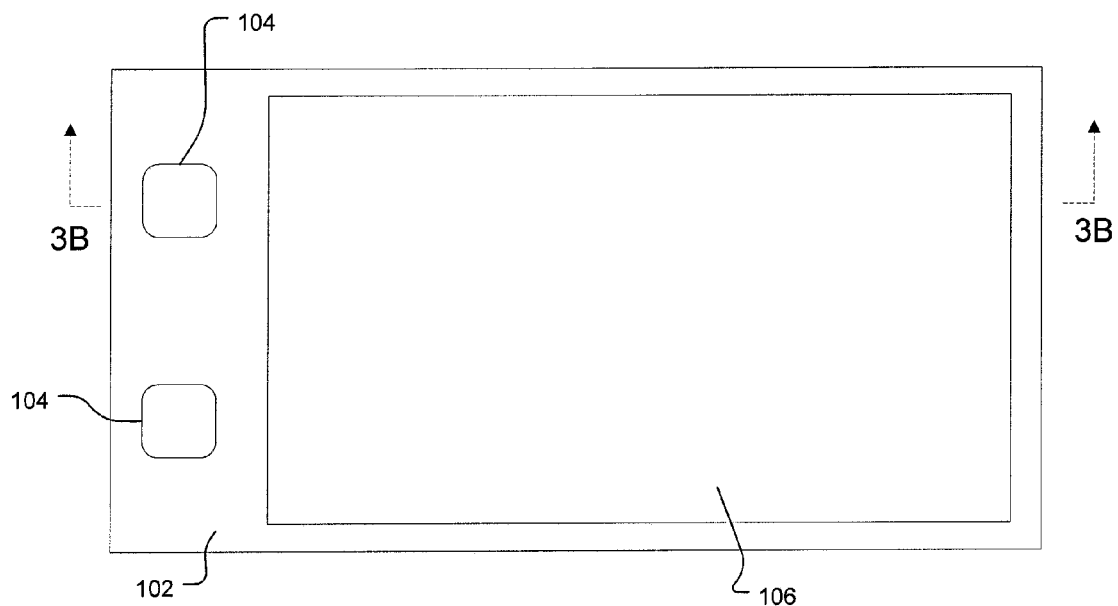
Figure 3B:
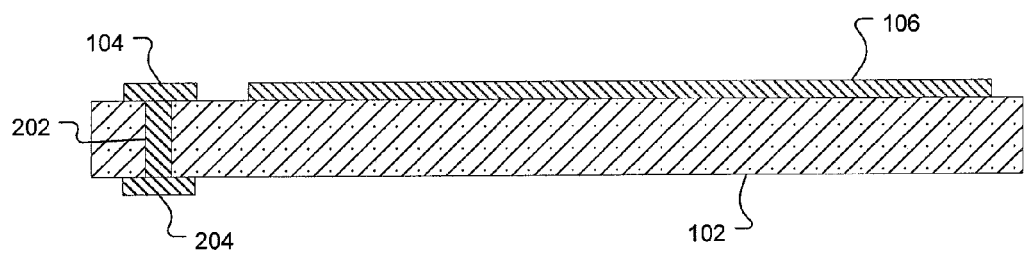

As shown in FIGS. 3A and 3B (FIG. 3A shows a top view, and FIG. 3B shows a side, cross-sectional view), plate 106 can be formed on the substrate 102. The plate 106 can comprise any one or more electrically conductive materials. For example, the plate 106 can comprise a sheet that is adhered (e.g., glued) or otherwise fastened to a surface of the substrate 102. As another example, material forming the plate 106 can be deposited onto the substrate 102. For example, one or more materials composing the plate 106 can be deposited onto the substrate 102 using chemical vapor deposition, physical vapor deposition, sputter deposition, electroless plating, electron beam deposition, thermal evaporation, electroplating, etc. If the material or materials composing the plate 106 are electroplated onto the substrate 102, a conductive seed layer (not shown) can first be deposited onto the substrate 102, and the material or materials composing the plate 106 can be electroplated onto the seed layer (not shown). As yet another example, the plate 106 can be formed by depositing a conductive paste or pastes onto the substrate 102 and then curing or otherwise allowing the paste or pastes to harden and form the plate 106. Non-limiting examples of suitable conductive pastes include without limitation photoreactive pastes comprising a conductive material, such as flakes of a conductive metal (e.g., copper, silver, nickel, etc.), a conductive polymer, a conductive oxide (e.g., indium tin oxide), etc. Silver filled epoxies are also nonlimiting examples of a suitable conductive paste. The paste or pastes composing the plate 106 can be deposited onto the substrate 102 in the desired shape of the plate 106, or the paste or pastes can be patterned after being deposited onto the substrate 102. For example, portions of the paste or pastes deposited onto the substrate 102 can be removed to shape the portions of the paste or pastes on the substrate 102 into the desired form of the plate 106.

Figure 4A:
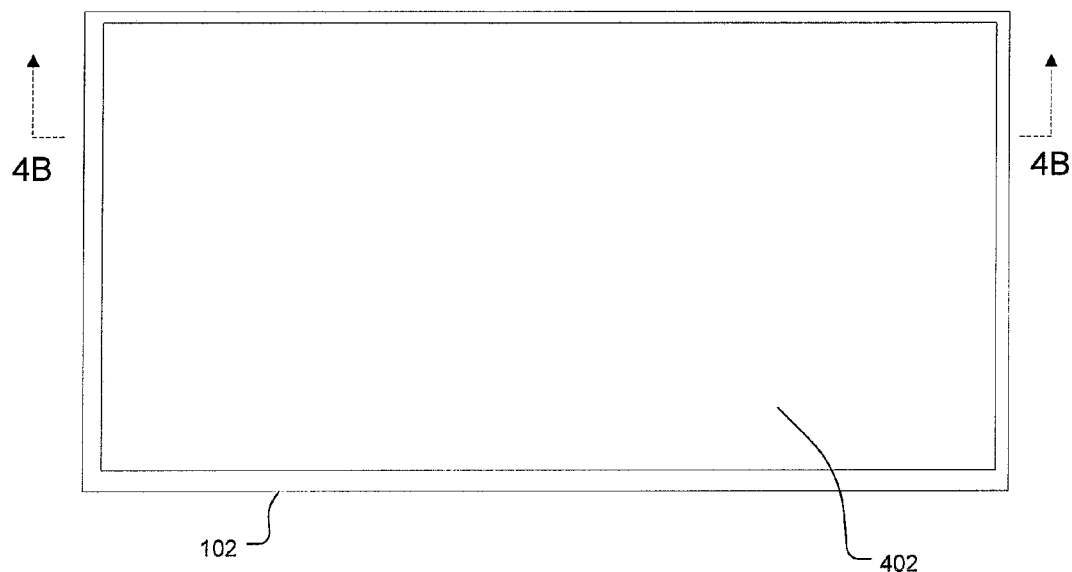
Figure 4B:
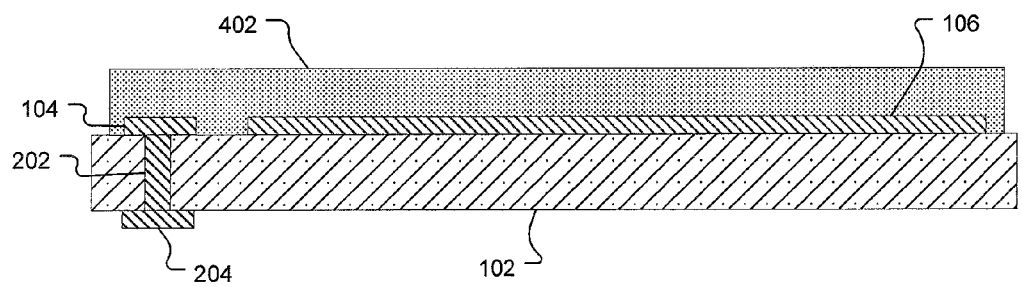
Figure 5A:
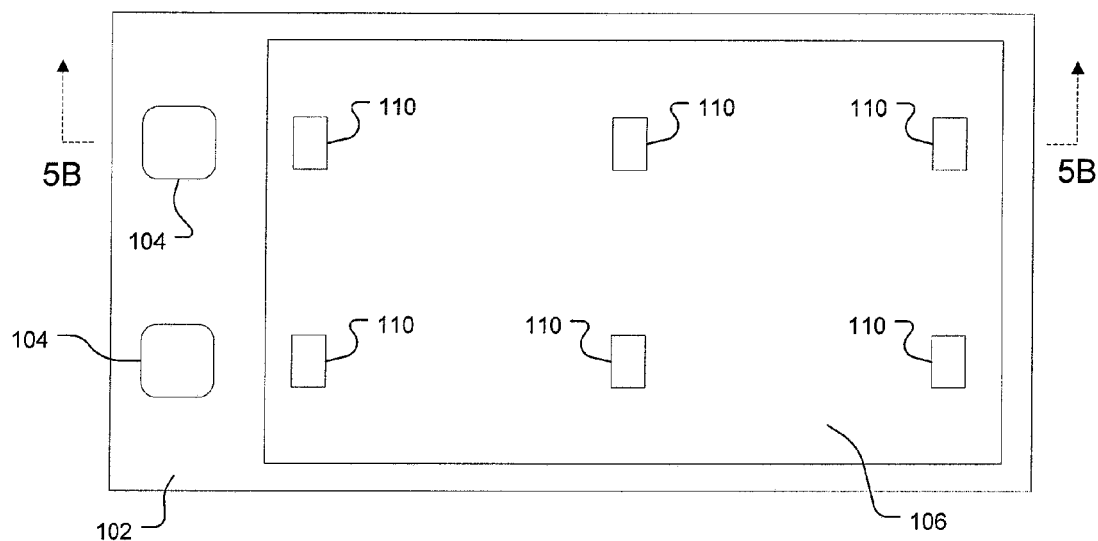
Figure 5B:
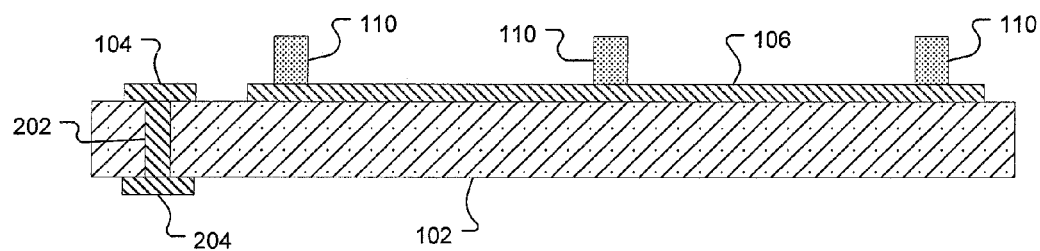

As shown in FIGS. 4A and 4B (FIG. 4A illustrates a top view, and FIG. 4B illustrates a side, cross-sectional view), a material 402 can be deposited onto the substrate 102. As shown in FIGS. 5A and 5B (FIG. 5A shows a top view, and FIG. 5B shows a side, cross-sectional view), portions of the material 402 can be removed to form the pylons 110 that support the traces 112 over the plate 106 (see FIG. 1). The material 402 can be deposited and patterned to form pylons 110 in many different ways. For example, the material 402 can be a photoreactive paste that is deposited onto the substrate 102 and plate 106 as shown in FIGS. 4A and 4B. Many different types of photoreactive pastes are known, and any such paste can be used. For example, the photoreactive paste can be a dry film photoresist material. Moreover, such pastes can be deposited onto the substrate 102 and plate 106 using any suitable method. For example, the paste can be dispensed through a dispensing tool, applied using a brush or an application tool, etc.

The photoreactive paste can be patterned by exposing selective portions of the paste to light (e.g., ultra-violet light). For example, if the paste has positive photoreactive properties, the paste (deposited as material 402 in FIGS. 4A and 4B), can be exposed to a source of light (e.g., ultra-violet light) through a mask that blocks the light from hitting portions of the paste where pylons 110 are to be formed. As is known, light weakens and dissolves a positive photoreactive material. Thereafter, the portions of the paste that were exposed to the light can be removed, leaving the pylons 110 as shown in FIGS. 5A and 5B. As another example, if the paste has negative photoreactive properties, the paste (deposited as material 402) in FIGS. 4A and 4B, can be exposed to a source of light through a mask that allows the light to hit only the portions of the paste where pylons 110 are to be formed. As is known, light hardens a negative photoreactive material. Thereafter, the portions of the paste that were not exposed to the light can be removed, leaving the pylons 110 as shown in FIGS. 5A and 5B.

Material 402 need not, however, be a photoreactive material. Rather, material 402 can be any material that can be deposited onto the substrate 102 as shown in FIGS. 4A and 4B and patterned to form pylons 110 as shown in FIGS. 5A and 5B. For example, material 402 can be a material that is deposited as shown in FIGS. 4A and 4B and then etched, cut (e.g., ablated with a laser), etc. to form the pylons 110 as shown in FIGS. 5A and 5B. Material 402 can be any material suitable for pylons 110 that support traces 112 (see FIG. 1). As mentioned above, material 402 can be a photoreactive paste. Other non-limiting examples of material 402 include polymers, polyimides, plastics, rubber materials, organic materials, inorganic materials, etc. Metals or other conductive materials can also compose material 402.

Figure 6A:
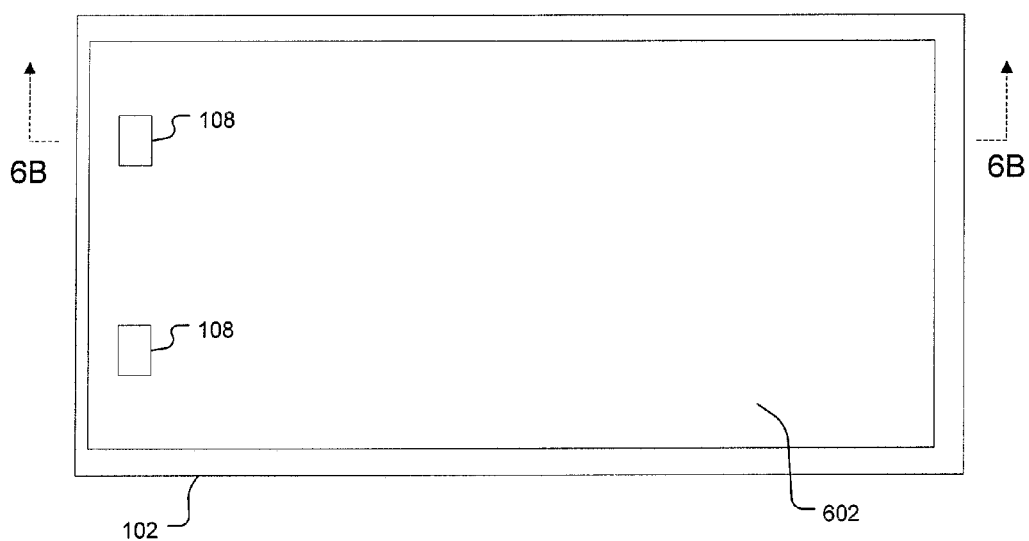
Figure 6B:
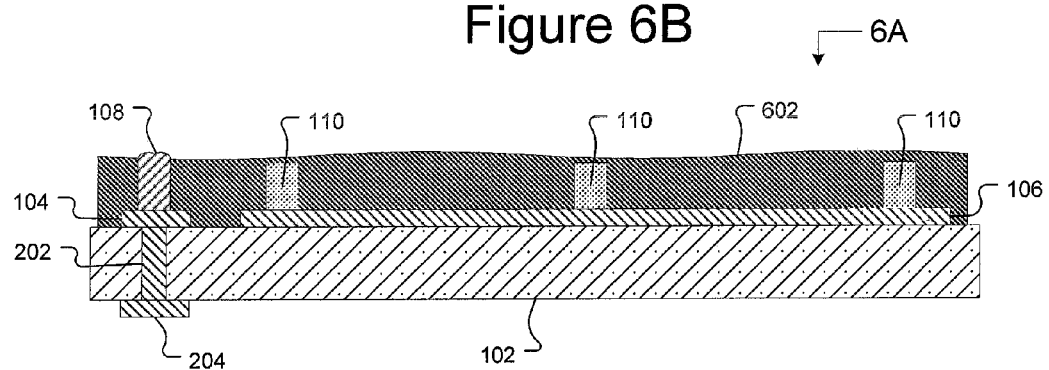

After the pylons 110 are formed, a fill material 602 can be deposited on the substrate 102 as shown in FIGS. 6A and 6B. (FIG. 6A shows a top view, and FIG. 6B shows a side, cross-sectional view.) As also shown in FIGS. 6A and 6B, openings (not shown) to terminals 104 can be formed in the fill material 602, and those openings (not shown) can be filled with a conductive material to form conductive pylons 108, which as discussed above with respect to FIG. 1, can electrically connect a trace 112 to a terminal 104. The fill material 602 can be any suitable material. For example, the fill material 602 can be a photoresist material, and the openings (not shown) in which conductive pylons 108 are formed can be formed by exposing selected portions of the fill material 602 to light. The material forming conductive pylons 108 can be deposited into the openings (not shown) in the fill material 602 using any suitable process. For example, the material forming the conductive pylons 108 can be electroplated onto portions of the terminals 104 that are exposed by the openings (not shown) in the fill material 602 and thus fill the openings (not shown).

Figure 7A:
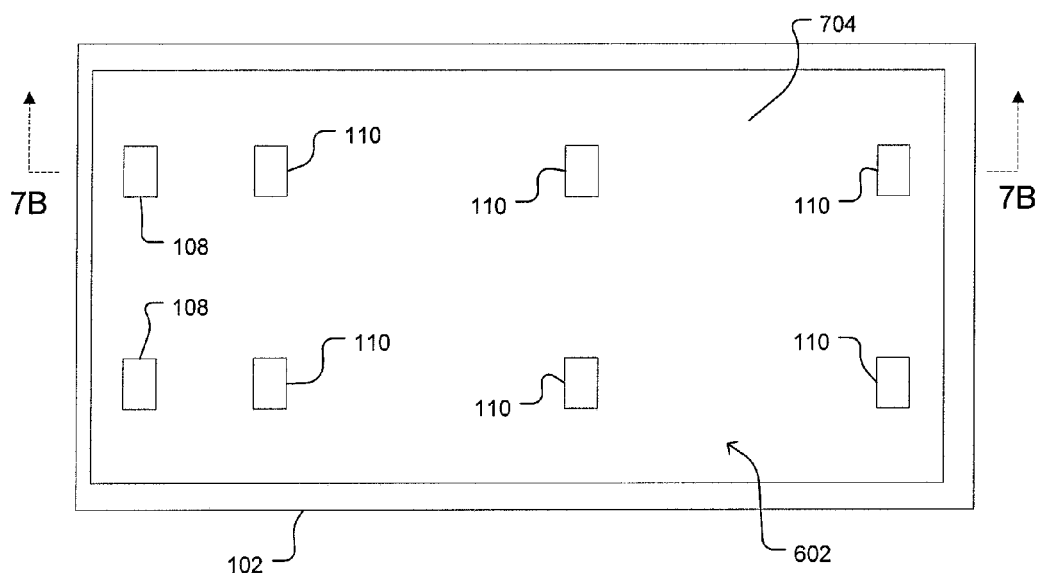
Figure 7B:
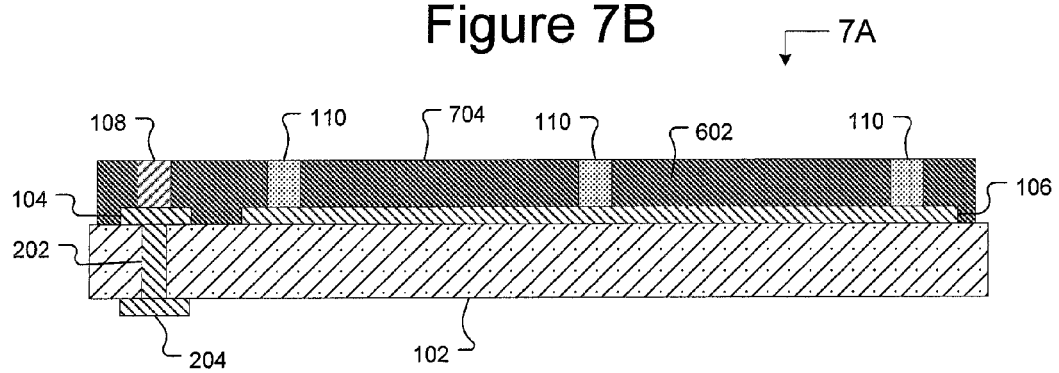

As shown in FIGS. 7A and 7B (FIG. 7A shows a top view, and FIG. 7B shows a side, cross-sectional view), an outer surface of the fill material 602 can be smoothed (e.g., planarized). For example, the outer surface of the fill material 602 can be ground using a mechanical grinding tool (e.g., a diamond based or silicon-carbide based grinding tool) or a chemical-mechanical grinding tool (e.g., tools that use a slurry of silicon dioxide, aluminum oxide, or cesium oxide). As also shown in FIGS. 7A and 7B, portions of the pylons 110 and the conductive pylons 108 can also be smoothed or planarized, which can make the pylons 108, 110 extend from the substrate 102 by approximately the same distance and can also create a planar surface 704 comprising the fill material 602, the pylons 110, and the conductive pylons 108.

Figure 8A:
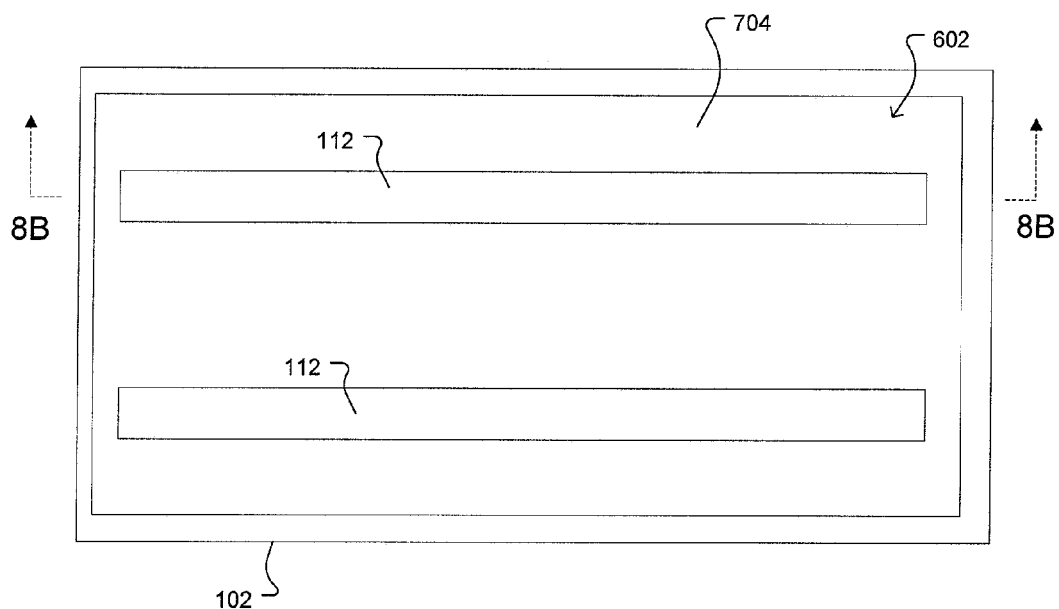
Figure 8B:
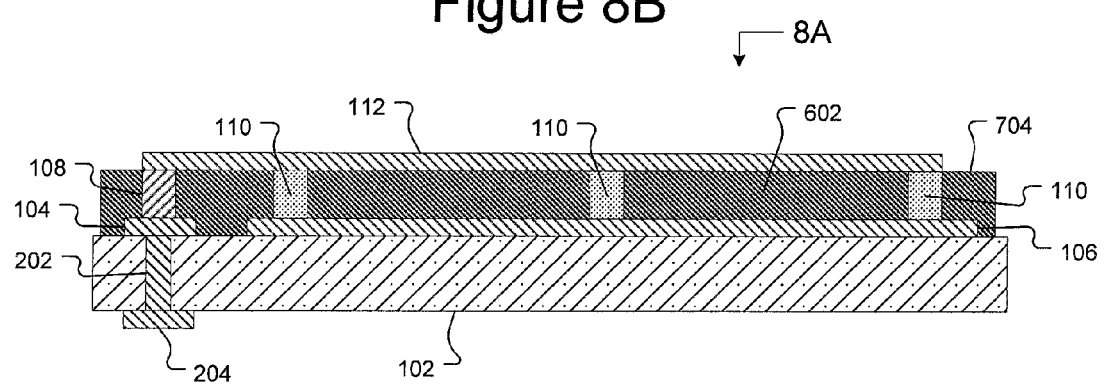

As shown in FIGS. 8A and 8B, the traces 112 can be formed on the planar surface 704. The traces 112 can be formed over ends of the pylons 110 and conductive pylons 108 that are exposed through surface 704. The traces 112 can be formed of any conductive material, and the traces 112 can be formed and patterned using any of the methods discussed above with respect to forming and patterning the plate 106.

Figure 9A:
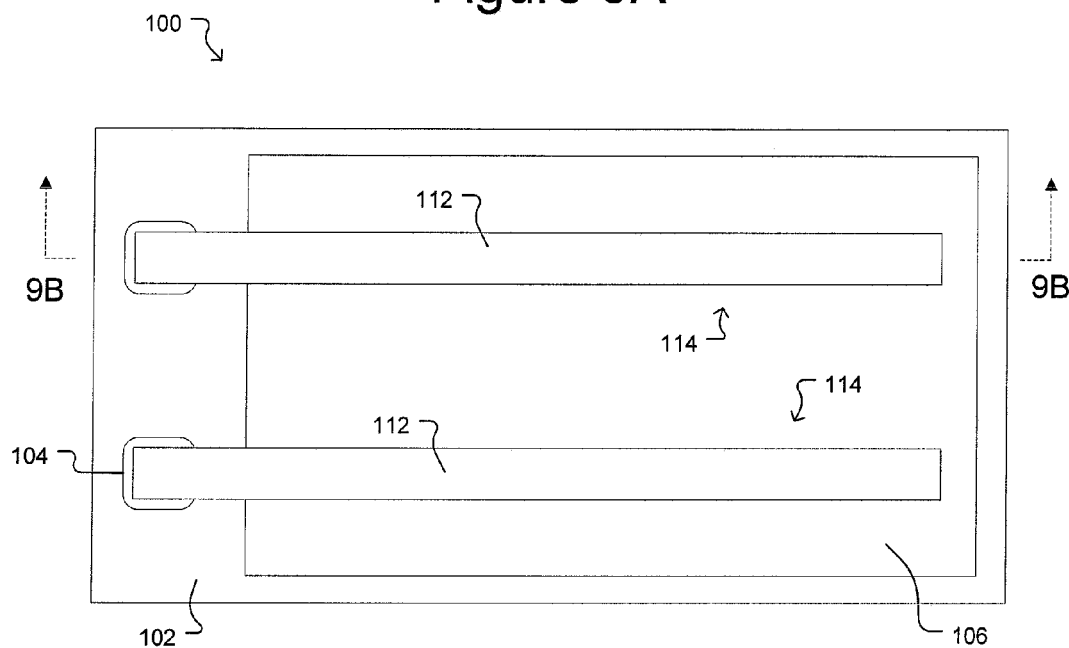
Figure 9B:
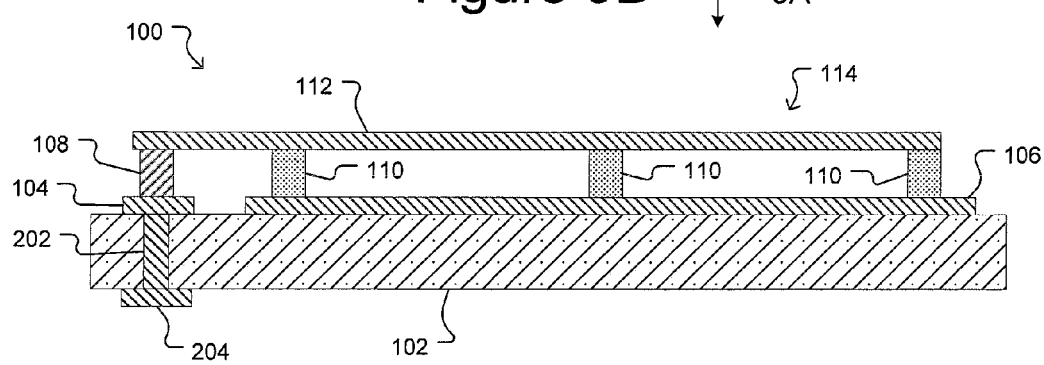

As shown in FIGS. 9A and 9B (FIG. 9A shows a top view, and FIG. 9B shows a side, cross-sectional view), the fill material 602 can be removed. For example, the fill material 602 can be washed in a solvent that dissolves the fill material 602 but does not appreciably dissolve the elements of the electronic device 100, such as the trace 112, pylons 110, conductive pylons 108, terminals 104, plate 106, and substrate 102. As shown in FIGS. 9A and 9B, the result can be the electronic device 100 of FIG. 1 with air bridge structures 114 comprising a conductive trace 112 supported by pylons 110 and a conductive pylon 108 electrically connecting the trace 112 to a terminal 104. As mentioned above, although not shown in FIGS. 1, 9A, or 9B, each air bridge structure 114 can extend and connect to one or more other terminals (e.g., like terminal 104) or electrical elements or connectors on substrate 102. In this way, traces 112 can provide or be part of electrical paths between terminals (e.g., like 104), electrical elements, or connectors on the substrate 102.

Figure 10:
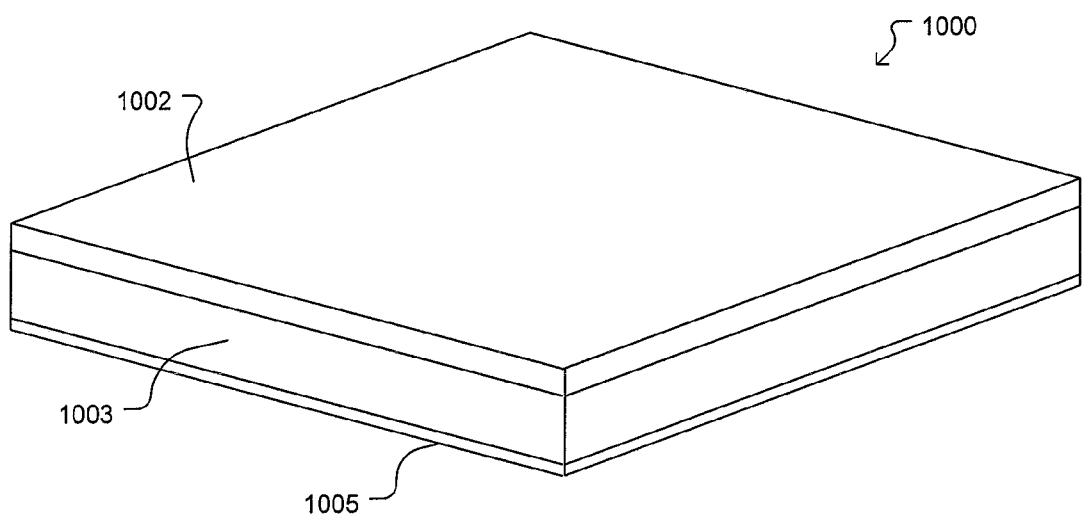
FIGS. 10, 11B, 12A, 12B, 13A, 13B, 14A and 14B illustrate another exemplary process for making air bridge structures according to some embodiments of the invention.

FIGS. 10-15 illustrate another exemplary process for making an electronic device that includes air bridge structures. As shown in FIG. 10, a multi-layered substrate 1000 can be made or provided. For example, substrate 1000 can comprise a conductive sheet layer 1002 (e.g., comprising copper or another metal), a layer of dielectric material 1003, and a layer of adhesive material 1005.

Figure 11A:
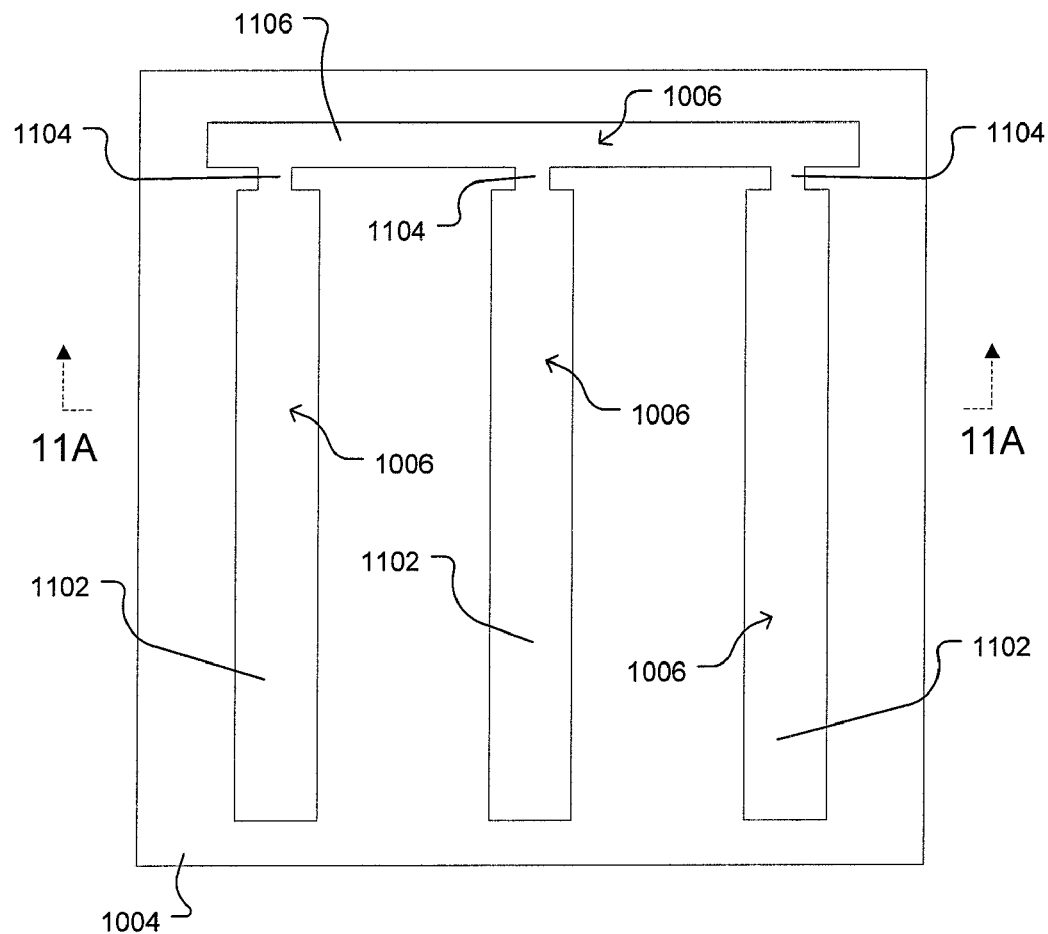
Figure 11B:
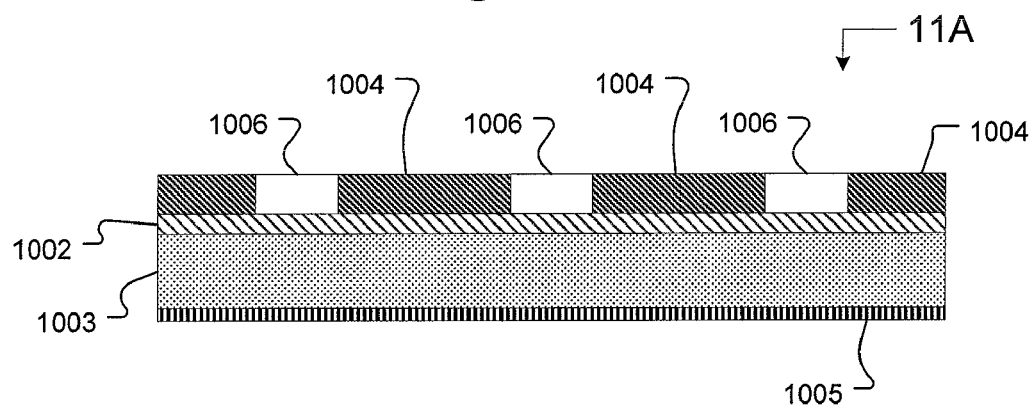

As shown in FIGS. 11A and 11B (FIG. 11A shows a top view, and FIG. 11B shows a side, cross-sectional view), a masking material 1004 can be deposited on the sheet layer 1002 and patterned to have one or more openings 1006. As will be seen, traces (e.g., like traces 112) of air bridge structures (e.g., like air bridge structures 114) can be formed in the openings 1006. Consequently, openings 1006 can be shaped in the desired shape of the traces. Openings 1006 can also be shaped to include portions defining handling or other convenience features, as will be discussed below. In the example shown in FIGS. 11A and 11B, the opening 1006 includes portions 1102 in which the traces (see 1012 of FIGS. 12A and 12B) can be formed, a portion 1106 in which a tie bar (see 1014 of FIG. 12A) can be formed, and portions 1104 in which break extensions (see 1016 of FIG. 12A) can be formed.

Figure 12A:
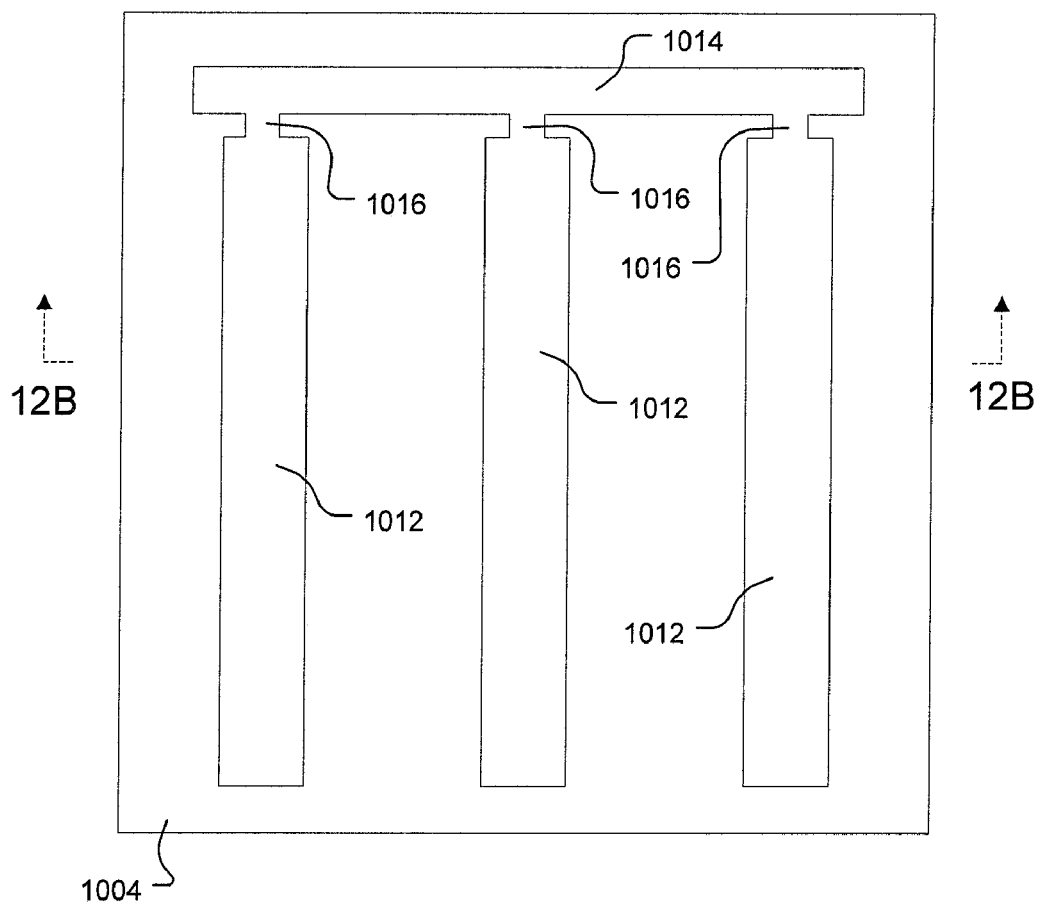
Figure 12B:
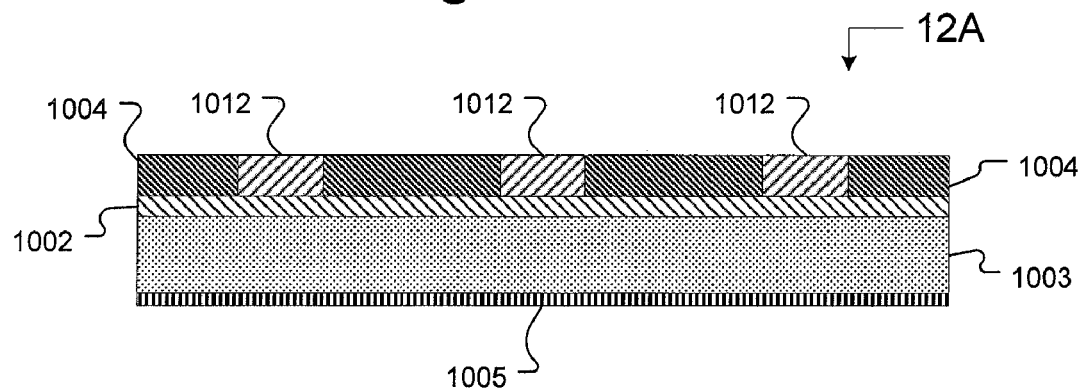

As shown in FIGS. 12A and 12B (FIG. 12A shows a top view and FIG. 12B shows a side, cross-sectional view), opening 1006 (see FIGS. 11A and 11B) can be filled with one or more materials to form electrically conductive traces 1012, a tie bar 1014, and break extensions 1016. The tie bar 1014 can interconnect the traces 1012 and can be used as a convenience for handling the traces 1012. Break extensions 1016 can connect the traces 1012 to the tie bar 1014 and can facilitate eventual separation of the traces 1012 from the tie bar 1014.

The material or materials that fill the opening 1006 to form the traces 1012 and the break extensions 1016 and the tie bar 1014 can be any suitable material and can be deposited into the opening 1006 in any suitable manner. For example, the material or materials deposited into the opening 1006 can be copper and/or another metal or other metals. Moreover, the material or materials (e.g., copper and/or another metal or other metals) can be electroplated onto the portions of the sheet layer 1002 that are exposed by opening 1006. Alternatively, deposition methods other than electroplating can be used. For example, the material(s) can be deposited into the openings 1006 by chemical vapor deposition, physical vapor deposition, sputter deposition, electroless plating, electron beam deposition, evaporation (e.g., thermal evaporation), flame spring coating, plasma spray coating, etc. After filing opening 1006, any excess material deposited into the opening 1006 can be removed by, for example, grinding or planarizing the top surface of the masking material 1004 and the material(s) deposited into the openings 1006.

Traces 1012 and optional tie bar 1014 and break extensions 1016 can alternatively be formed without using a patterned masking material 1004. For example, the material or materials forming the traces 1012 and tie bar 1014 and break extensions 1016 can be deposited onto sheet layer 1002 through a mask patterned in the desired shapes of the traces 1012 and break extensions 1016 and tie bar 1014.

Figure 13A:
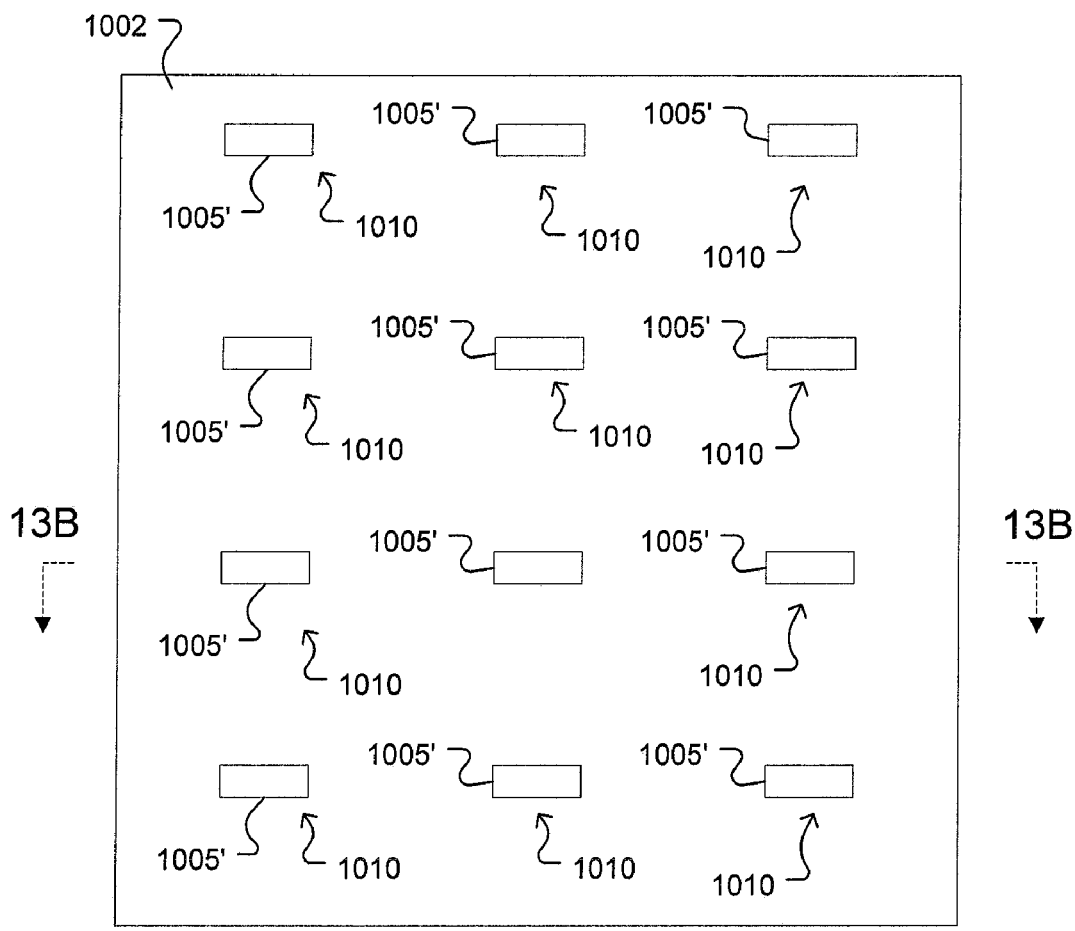

As shown in FIGS. 13A-14B, pylons 1010 attached to the traces 1012 can be formed from the adhesion layer 1005, dielectric layer 1003, and sheet layer 1002. As shown in FIGS. 13A and 13B (FIG. 13A shows a bottom view, and FIG. 13B shows a side, cross-sectional view), portions of the pylons 1010 can be formed by selectively removing portions of the adhesive layer 1005 and the dielectric layer 1003, leaving remaining portions of the adhesive layer 1005' and the dielectric layer 1003'. The selected portions of the adhesive layer 1005 and the dielectric layer 1003 can be removed using any suitable method. For example, the selected portions of the adhesive layer 1005 and the dielectric layer 1003 can be removed using a laser (e.g., the selected portions of the adhesive layer 1005 and the dielectric layer 1003 can be ablated) or other cutting tool (e.g., a knife). As an alternative, the selected portions of the adhesive layer 1005 and the dielectric layer 1003 can be etched away or otherwise removed by dissolving the selected portions with an etchant, solvent, chemical solution, etc. The remaining portions of the adhesive layer 1005' and the dielectric layer 1003' can be protected from such etching, dissolving, chemical, or other type of treatment by protecting or isolating the remaining portions of the adhesive layer 1005' and the dielectric layer 1003' from the etchant, solvent, or chemical solution. For example, a patterned mask can be disposed on the adhesive layer 1005, and the mask can prevent the etchant, solvent, or other chemical solution from etching or dissolving the portions of the adhesive layer 1005' and the dielectric layer 1003' that are to remain and form the pylons 1010.

Figure 13B:
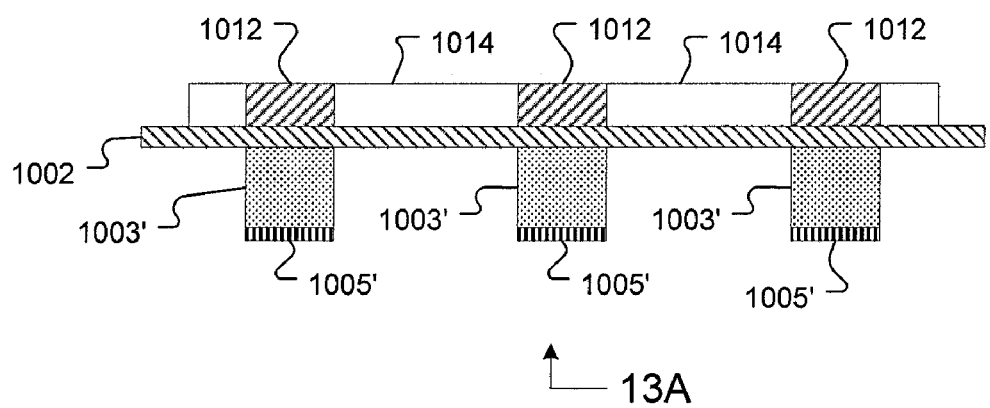
Figure 14A:
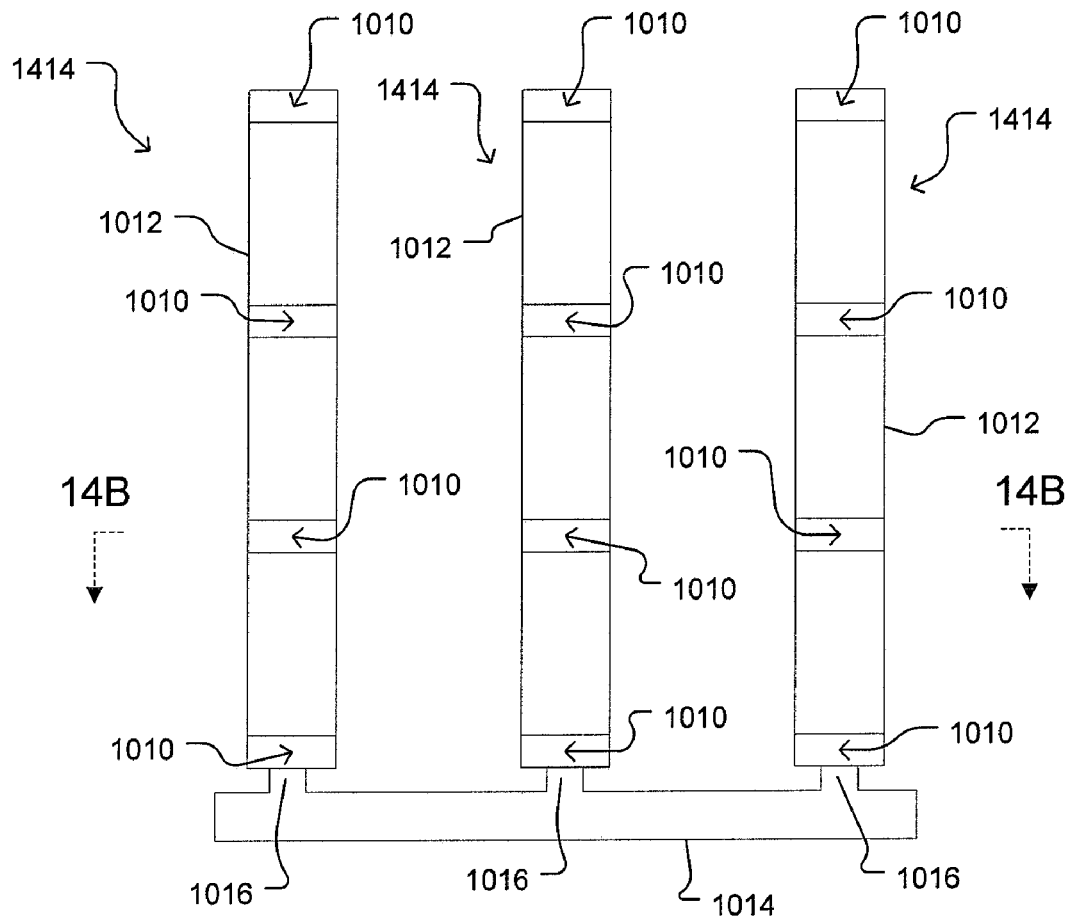
Figure 14B:
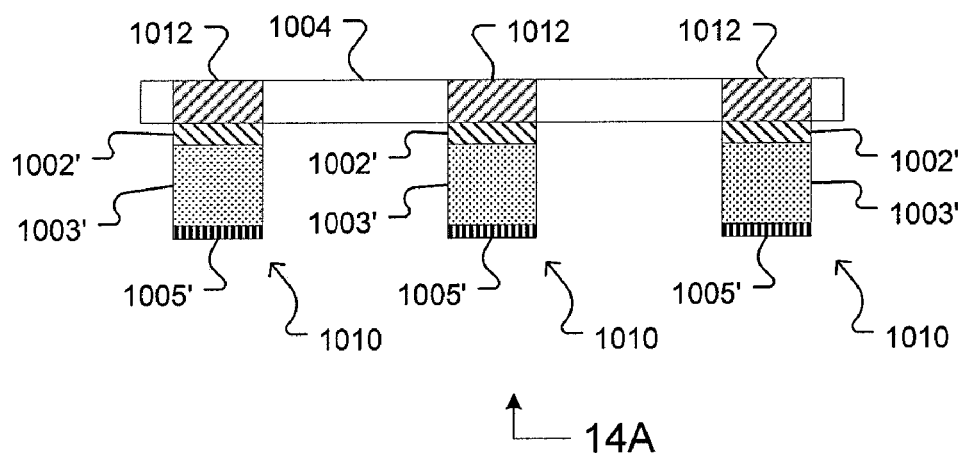

As shown in FIGS. 14A and 14B (FIG. 14A shows a bottom view, and FIG. 14B shows a side, cross-sectional view), portions of the sheet layer 1002 can be removed, leaving only portions 1002' of the sheet layer 1002 that correspond to the remaining portions 1005', 1003' of the adhesion layer 1005 and the dielectric material 1003. Alternatively, portions of the sheet layer 1002 can be removed, leaving only portions that correspond to the traces 1012. Portions of the sheet layer 1002 can be removed by etching, laser ablation, cutting with a cutting tool, etc. As shown in FIG. 13B, the remaining portions 1005', 1003', 1002' of the adhesion layer 1005, dielectric material 1003, and sheet layer 1002 can form pylons 1010 attached to the traces 1012. FIGS. 10-14B thus show exemplary formation of a structure comprising a plurality of electrically conductive traces 1012 held together by a tie bar 1014 and to which a plurality of pylons 1010 are attached.

Figure 15:
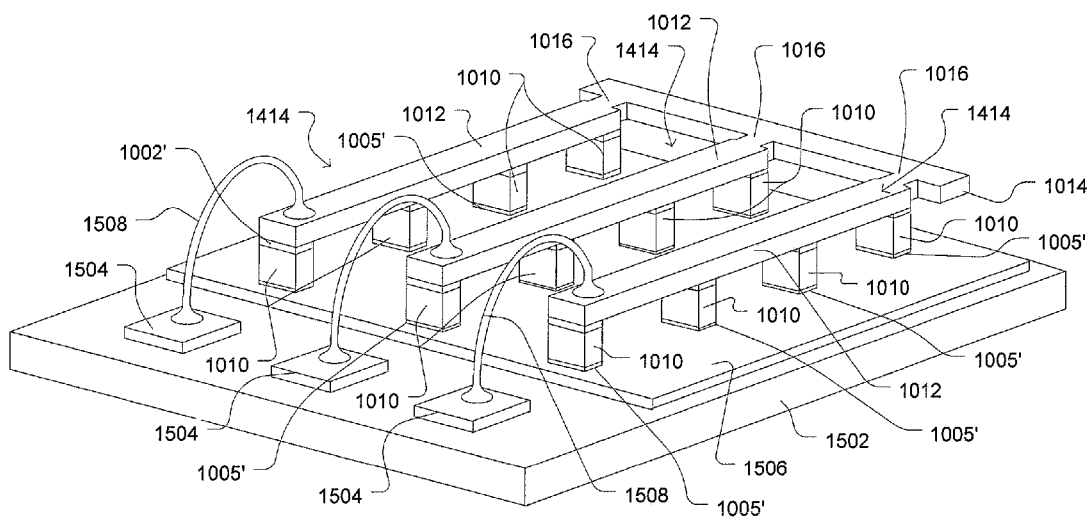
FIG. 15 shows air bridge structures made in accordance with the process of FIGS. 10-14B attached to a substrate according to some embodiments of the invention.

As shown in FIG. 15, the pylons 1010 can be attached to an electrically conductive plate 1506 (which can be like plate 106 in FIG. 1) on a substrate 1502 (which can be like substrate 102 of FIG. 1). The portions 1005' of the adhesive layer 1005 that form the pylons 1010 can adhere the pylons 1010 to the plate 1506. As shown in FIG. 15, the pylons 1010 can space the traces 1012 away from the plate 1506. For example, the pylons 1010 can elevate the traces 1012 above the plate 1506. As also shown in FIG. 15, the traces 1010 can be electrically connected to one or more terminals 1504 (which can be like terminals 104 of FIG. 1). In the example shown in FIG. 15, each trace 1010 can be electrically connected to a terminal 1504 by a wire 1508 that is bonded at one end to a trace 1012 and at the other end to a terminal 1504. A trace 1012 can be electrically connected to more than one terminal (e.g., like terminal 1504). For example, a trace 1012 can be connected at one end to a terminal 1504 and at another end to another terminal or other connection element on substrate 1502 (not shown). Moreover, one or more of the traces 1012 can be electrically connected to a terminal 1504 by connectors other than wires 1508. For example, similar to the configuration shown in FIG. 1, one of the pylons 1010 (e.g., like pylon 108 in FIG. 1) can be made of an electrically conductive material and can be disposed on one of the terminals 1504. As with the air bridge structures 114 of FIG. 1, the pylons 1010 can be sized and configured to occupy a selected portion of the area of a trace 1012. Thus, the bridge structures 1414 can be configured to have the same percentages discussed above with respect to bridge structures 114 of ambient air as the dielectric material between a trace 1012 and the plate 1506.

As discussed above, the tie bar 1014 can be used to facilitate handling and manipulation of the bridge structures 1414. Once the bridge structures 1414 are attached to the plate 1506, the tie bar 1014 can be separated from the traces 1012 and discarded. Break extensions 1016 can facilitate separating the tie bar 1014 from the traces 1012. Alternatively, individual bridge structures 1414 can be separated from the tie bar 1014 prior to attaching the individual bridge structures 1414 to the plate 1506. Again, break extensions 1016 can facilitate separating the traces 1012 from the tie bar 1014. The tie bar 1014 and break extensions 1016 are optional, however, and need not be formed or used.

Figure 16A:
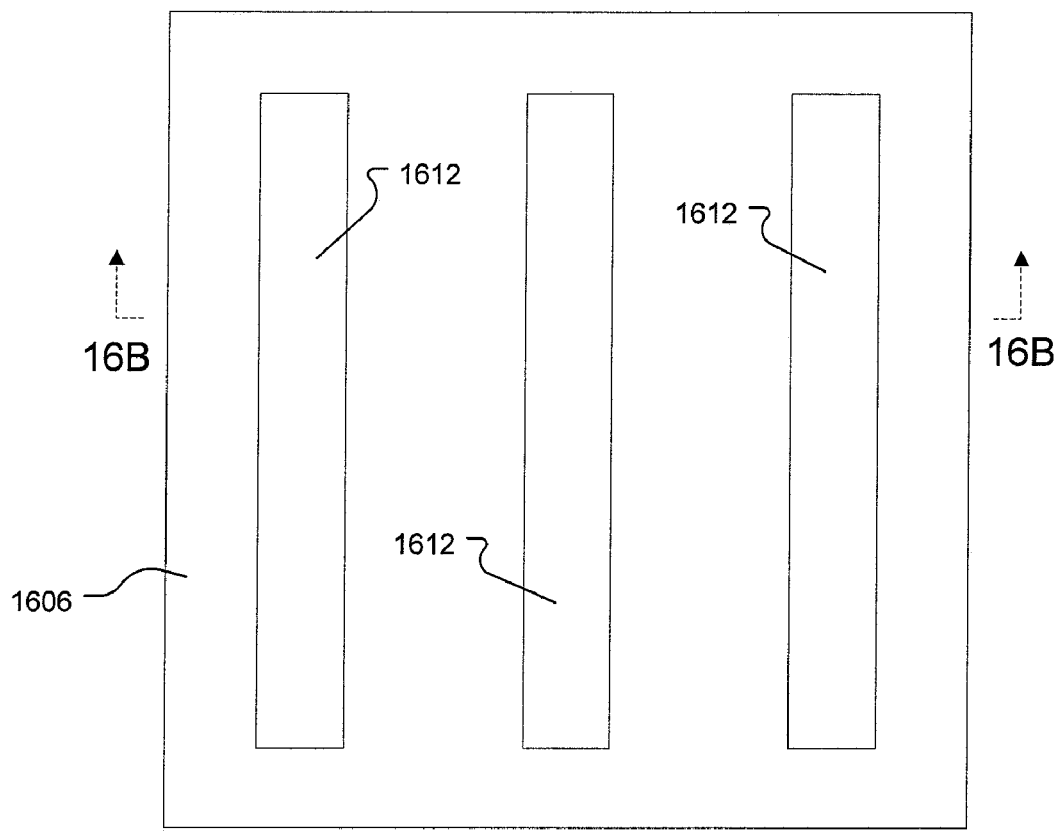
FIGS. 16A, 16B, 17A, 17B, 18A and 18B illustrate yet another exemplary process for making air bridge structures according to some embodiments of the invention.
Figure 16B:
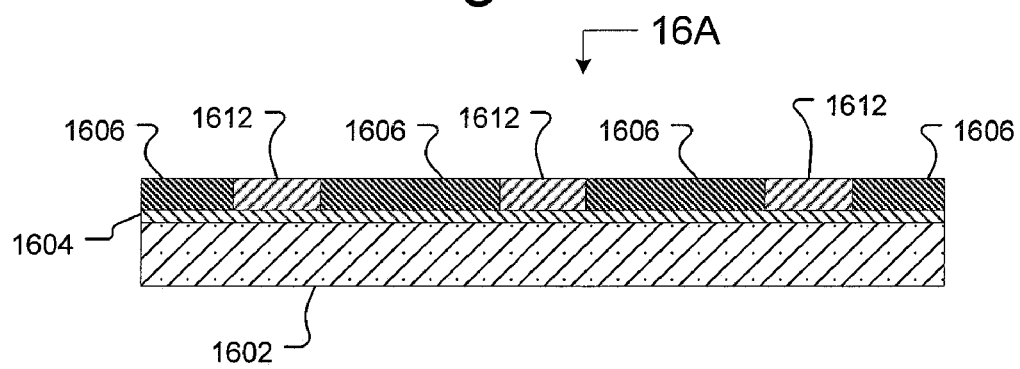

FIGS. 16A-19 illustrate another exemplary process for making an electronic device that includes air bridge structures according to some embodiments of the invention. FIGS. 16A and 16B (FIG. 16A illustrates a top view, and FIG. 16B illustrates a side, cross-sectional view) illustrate a sacrificial or removable substrate 1602 on which can be deposited a seed/release layer 1604. The substrate 1602 can be any substrate suitable for use as a platform on which to form air bridge structures. For example, substrate 1602 can be a blank semiconductor wafer, a ceramic substrate, an organic substrate, an inorganic substrate, etc. The seed/release layer 1604 can be any conductive material that can be removed (e.g., etched away). Examples of suitable materials for the seed/release layer 1604 include without limitation copper, palladium, titanium, tungsten, silver, aluminum, gold, and their alloys including combinations of the forgoing. As also shown in FIGS. 16A and 16B, a masking material 1606 can be deposited over the seed/release layer 1604 and patterned to have openings (not shown) to the seed/release layer 1604, and the openings can be filled with one or more materials to form traces 1612. The masking material 1604 can be like masking material 1004 shown in FIGS. 11A and 11B and can be processed and patterned like masking material 1004. Traces 1612 can be generally similar to traces 1012 in FIG. 12A and 12B. For example, traces 1612 can comprise the same or similar material or materials as traces 1012, and that material or materials can be deposited into the openings (not shown) in the masking material 1604 in the same or similar manner as the material or materials that form traces 1012 of FIGS. 12A and 12B are deposited into the openings 1006 shown in FIGS. 11A and 11B. For example, the material or material that forms traces 1612 can be electroplated onto portions of the seed/release layer 1604 exposed by the openings (not shown) in the masking material 1606. If deposition methods other than electroplating are used to deposit the material or materials composing the traces 1612 into the openings (not shown) in the masking material 1606 (e.g., chemical vapor deposition, physical vapor deposition, sputter deposition, electroless plating, electron beam deposition, evaporation (e.g., thermal evaporation), flame spring coating, plasma spray coating), the seed/release layer 1604 need not be electrically conductive and can function as a release layer. An outer surface of the masking material 1606 and the traces 1612 can be smoothed or planarized to remove any excess material deposited into the openings in the masking material 1606 and/or to smooth or planarize the traces 1612.

Figure 17A:
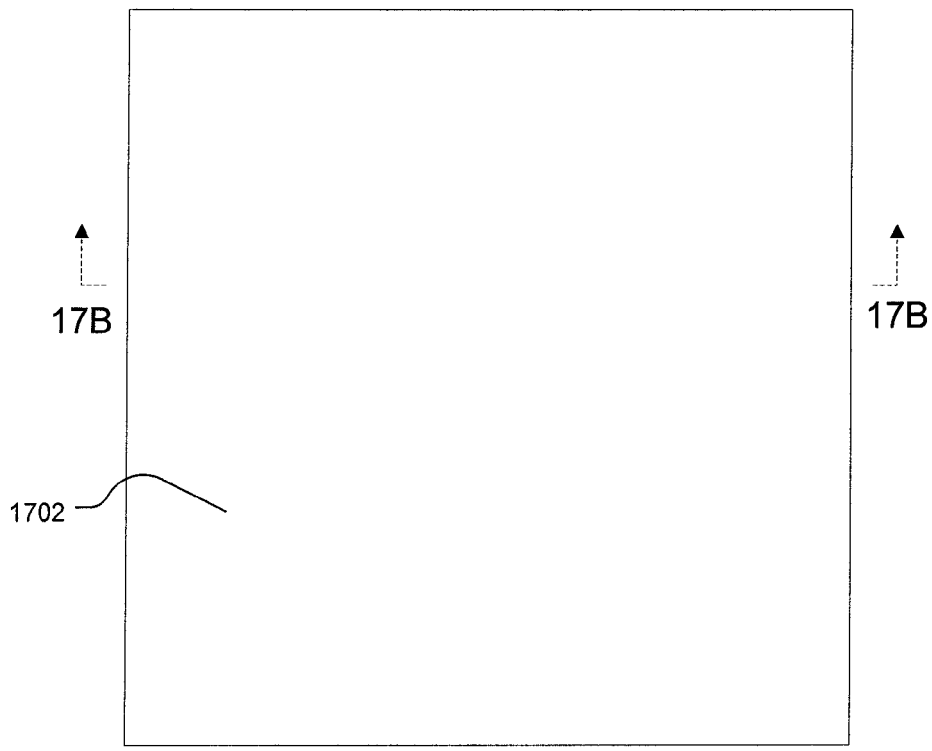
Figure 17B:
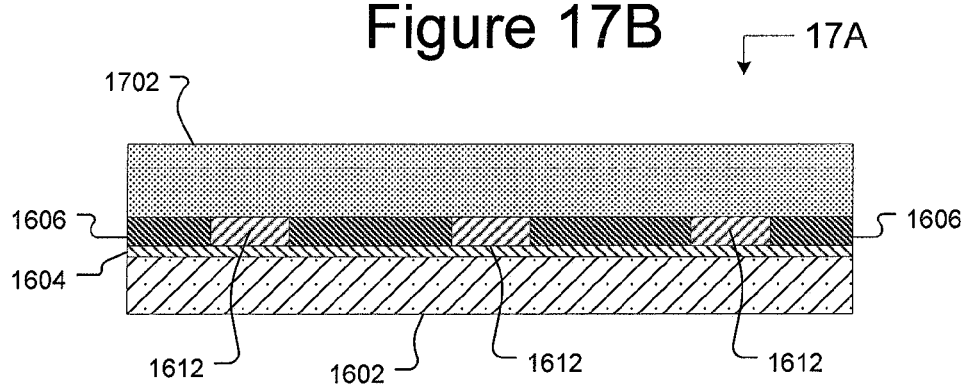
Figure 18A:
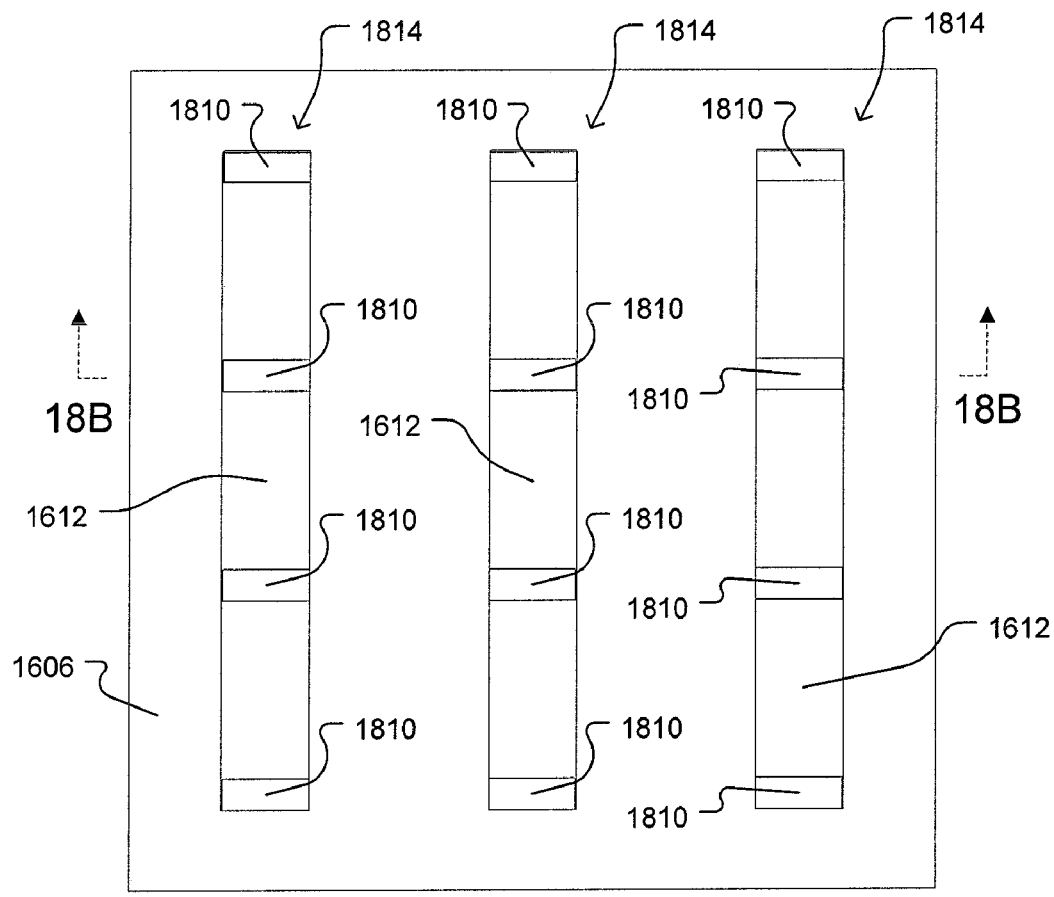
Figure 18B:
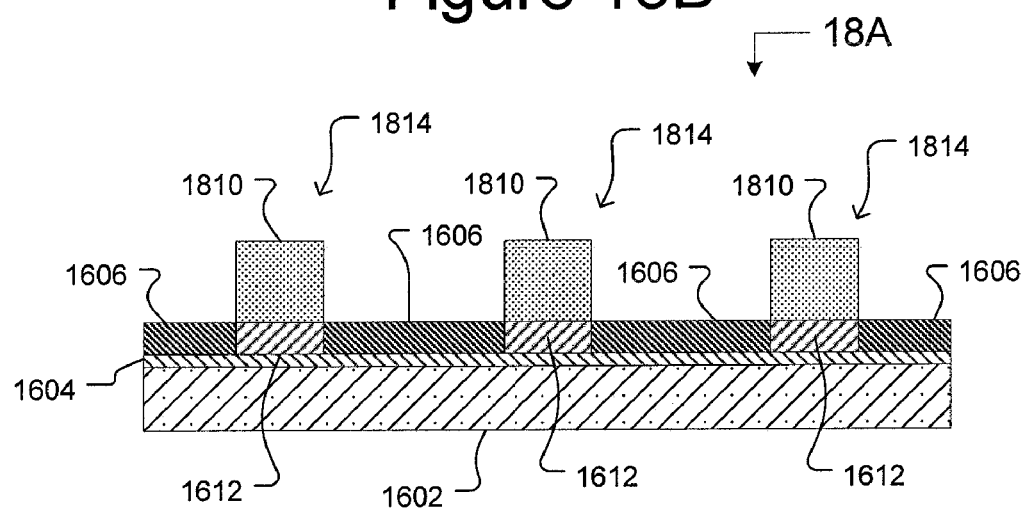

As shown in FIGS. 17A and 17B, a material 1702 can be deposited onto the masking material 1606 and the traces 1612, and as shown in FIGS. 18A and 18B, the material 1702 can be patterned to form pylons 1810 on the traces 1612. The material 1702 can be like the material 402 shown in FIGS. 4A and 4B and can be deposited and patterned to form pylons 1810 in the same or similar manner as the material 402 is deposited and patterned to form pylons 110 in FIGS. 4A-5B. The result can be a plurality of air bridge structures 1814 (three are shown but more or fewer can be made) comprising pylons 1810 attached to electrically conductive traces 1612, which are attached to the seed/release layer 1604 on sacrificial or removable substrate 1602. The air bridge structures 1814 can be generally similar to the air bridge structures 114 of FIG. 1 and 1414 of FIGS. 14A-15. For example, as with the air bridge structures 114 of FIG. 1, the pylons 1810 can be sized and configured to occupy a selected portion of the area of a trace 1612. Thus, the bridge structures 1814 can be configured to have the same percentages discussed above with respect to bridge structures 114 of ambient air as the dielectric material between a trace 1612 and a plate (e.g., like plate 106) to which the pylons 1810 are to be attached.

Figure 19:
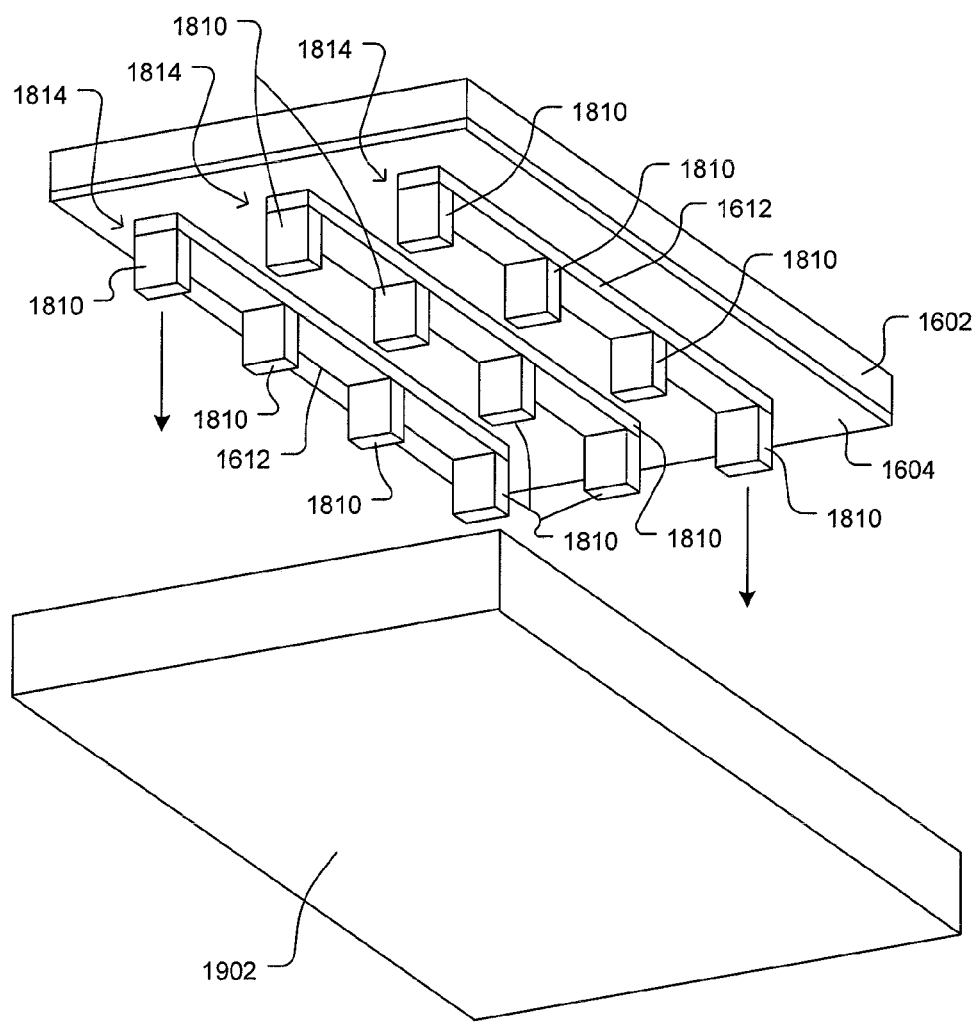
FIG. 19 illustrates attachment of air bridge structures made in accordance with the process of FIGS. 16A-18B to a substrate according to some embodiments of the invention.

As shown in FIG. 19, the masking material 1606 can be removed from the substrate 1602, the bridge structures 1814 can be attached by their pylons 1810 to a conductive plate (not visible in FIG. 19 but which can be like plate 106 of FIG. 1) on a substrate 1902 (which can be like substrate 102 of FIG. 1). The pylons 1810 can be attached to the plate (not shown) in any of the ways that the pylons 110 can be attached to the plate 106 of FIG. 1. The air bridge structures 1814 can then be released from the substrate 1602 by separating the traces 1612 from the substrate 1602, and the substrate 1602 can be discarded. The traces 1612 can be separated from the substrate 1602 by dissolving or etching the seed/release layer 1604. The seed/release layer 1604 can thus comprise a material that can be dissolved or etched using a solvent or etchant that does not appreciably dissolve or etch the traces 1612 or dissolves or etches the traces 1612 more slowly than the seed/release layer 1604.

The traces 1612 can be electrically connected to terminals (not shown), which can be like terminals 104 of FIG. 1 or 1504 of FIG. 15, on substrate 1902 using any of the connection configurations shown or discussed above with respect to FIGS. 1 and 15. For example, one or more of the pylons 1810 can be made of an electrically conductive material and can be attached to terminals (not shown) on substrate 1902 in the same or similar way that pylons 108 are attached to (and thus electrically connected to) the terminals 104 of FIG. 1. As another example, wires (not shown) like wires 1508 of FIG. 15 can be used to electrically connect the traces 1612 to terminals (not shown) on substrate 1902. Indeed, the method or methods of electrically connecting traces 1612 to terminals (not shown) or other connection elements (not shown) on substrate 1902 are not important to the invention, and any suitable method can be used.

Figure 20A:
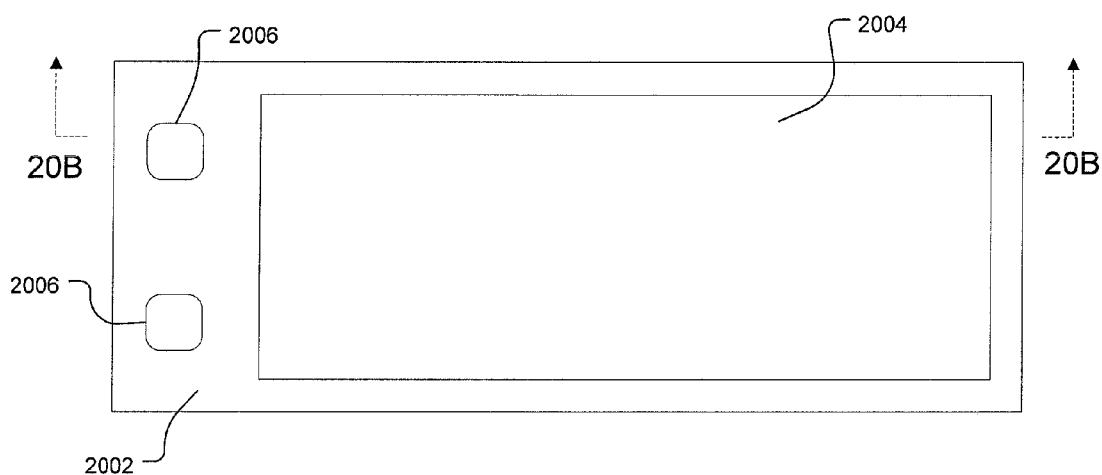
FIGS. 20A, 20B, 21A, 21B, 22A, 22B, 23A, 23B, 24A and 24B illustrate still another exemplary process for making air bridge structures according to some embodiments of the invention.
Figure 20B:
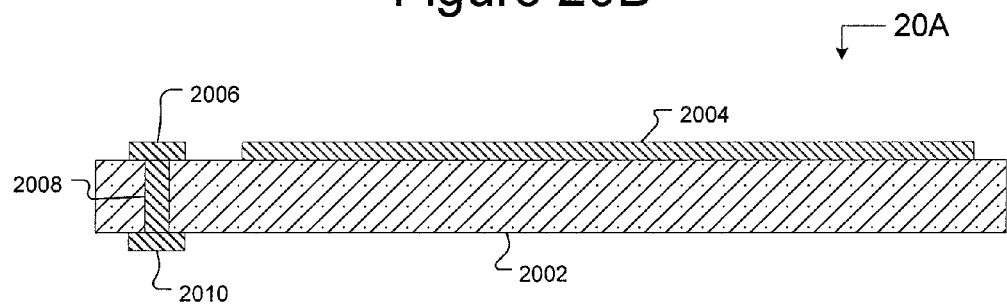

FIGS. 20A-24B illustrate yet another exemplary process for making an electronic device that includes air bridge structures according to some embodiments of the invention. FIGS. 20A and 20B (FIG. 20A shows a top view, and FIG. 20B shows a side, cross-sectional view) illustrate a substrate 2002 that can be generally similar to the substrate 102 shown in FIGS. 3A and 3B. For example, the substrate 2002 can comprise a plurality of terminals 2006, 2010 (which can be the same as or similar to terminals 104, 204 of FIGS. 3A and 3B), a plurality of vias 2008 (which can be generally similar to vias 202 of FIGS. 3A and 3B), and an electrically conductive plate 2004 (which can be generally similar to plate 106 of FIGS. 1, 3A, and 3B).

Figure 21A:
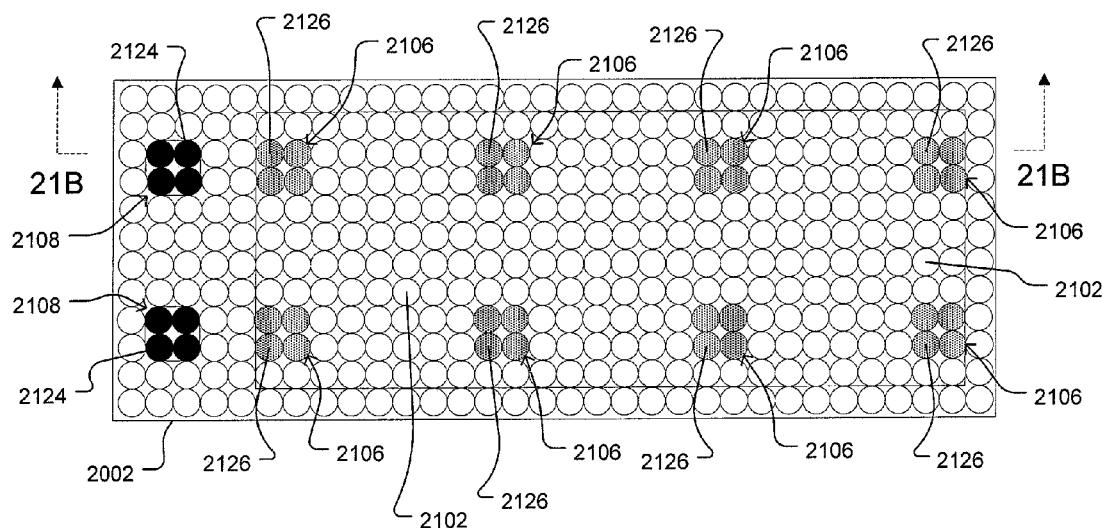
Figure 21B:
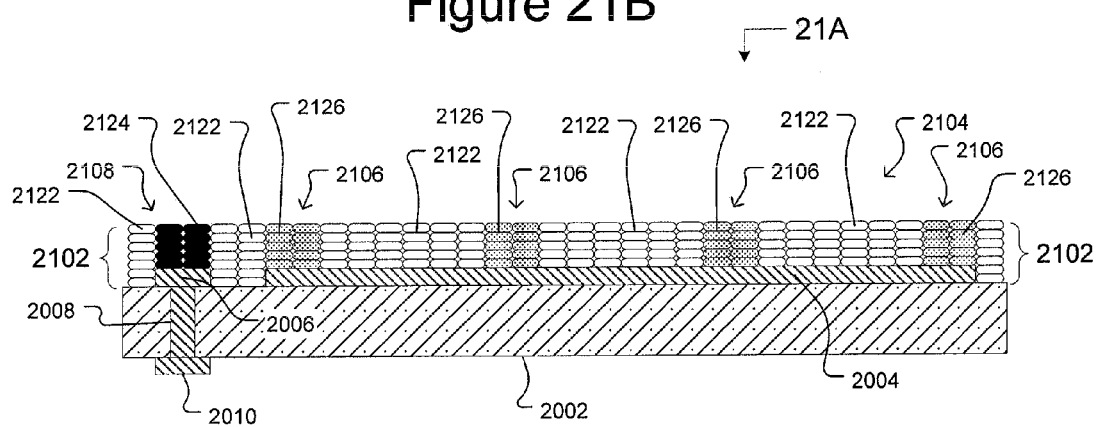

As shown in FIGS. 21A and 21B (FIG. 21A shows a top view, and FIG. 21B shows a side, cross-sectional view), layers 2102 of droplets can be deposited on the substrate 2002, plate 2004, and terminals 2006. The layers 2102 of droplets can comprise droplets made of different materials so that different droplets in the layers 2102 have different properties. For example, some of the droplets in layers 2102 can comprise a material or materials that are soluble in a particular solvent, and others of the droplets in layers 2102 can comprise a material or materials that are generally insoluble in that particular solvent. As another example, some of the droplets in layers 2102 can comprise a material or materials that are electrically conductive, and others of the droplets in layers 2102 can comprise a material or materials that are not appreciably electrically conductive.

In the example shown in FIGS. 21A and 21B, the layers 2102 of droplets can include droplets 2124 that are electrically conductive and droplets 2126 that are generally not electrically conductive (e.g., droplets 2106 can comprise one or more dielectric materials). The layers 2102 shown in FIGS. 21A and 21B can also include droplets 2122 that are soluble in a solvent that does not appreciably dissolve the droplets 2124 or the droplets 1226. For clarity and ease of illustration, the ovals representing the droplets 2124 that are electrically conductive are shaded black, the ovals representing the droplets 2126 that are not electrically conductive are shaded gray, and the ovals representing the droplets 2122 that are soluble in the solvent are white. As also shown in FIGS. 21A and 21B, the different droplets 2122, 2124, 2126 in layers 2102 can be deposited in patterns such that the electrically conductive droplets 2124 form electrically conductive pylons 2108 on terminals 2006, the non-conductive droplets 2126 form pylons 2106 on the plate 2004, and the soluble droplets 2122 generally fill space between the conductive pylons 2108 and the non-conductive pylons 2106.

As mentioned, the droplets 2122 can be made of a material or materials that are readily removed through a process that does not affect appreciable numbers of others of the droplets 2124, 2126. As one example, the droplets 2122 can be made of a material that is soluble in a particular solvent that does not appreciably dissolve the material or materials that compose droplets 2124, 2126. Examples of suitable materials for the droplets 2122 include, without limitation, water soluble resins (e.g., polyacrylic acid, polyacrylamide, etc.), and mixtures of or materials containing the foregoing. As another example, the droplets 2122 can comprise a material marketed under the trade name FullCure S-705 by Objet Geometries, Ltd. of Rehovot, Israel or Stratasys, Inc. of Eden Praine, Minn. Examples of suitable solvents for dissolving (and thus removing) the droplets 2122 include, without limitation, water, water mixed with an organic solvent (e.g., methanol, ethanol, isopropanol), etc.

Examples of suitable materials for the non-conductive droplets 2126 that form the pylons 2106 include, without limitation, polymers, polyphenylene sulfides, polyimides, polyetherimides, polyether-etherketones, epoxy resins, polyetones, and mixtures of or materials containing the foregoing. A material marketed under the trade name FullCure M-720 by Objet Geometries, Ltd. of Rehovot, Israel or Stratasys, Inc. of Eden Praine, Minn. is also a suitable material for the droplets 2126.

Examples of suitable materials for the electrically conductive droplets 2124 include, without limitation, any electrically conductive fluid that can be deposited on top of previous layers of droplets, including, without limitation, polyaniline, polythiophene, and mixtures of or materials containing the foregoing. A conductive ink marketed under the trade name NanoPaste by Harima Chemical, Inc. of Japan or Harimatec, Inc. of Duluth, Calif. can be used as a material for the conductive droplets 2124. Other non-limiting examples of materials suitable for the conductive droplets 2124 include, without limitation, polymers (e.g., epoxies, silicones, etc.) containing metal pieces or particles.

Figure 28:
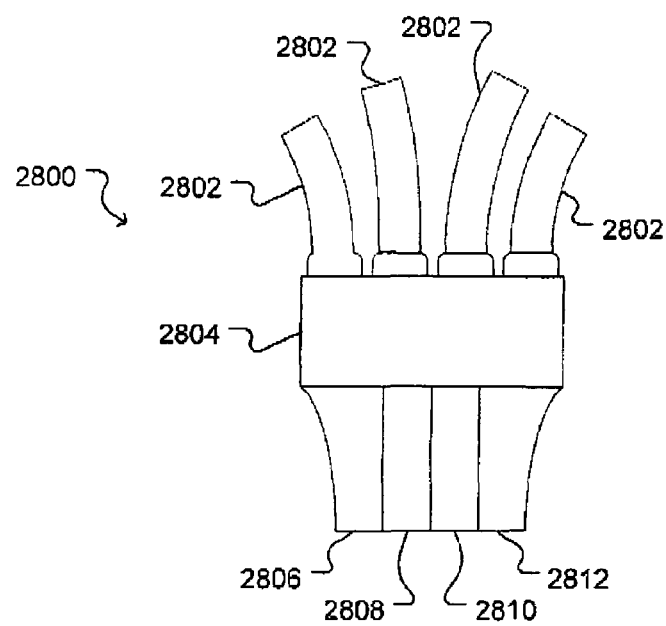
FIG. 28 illustrates a representative spray head for applying droplets to a substrate in accordance with some embodiments of the invention.
Figure 29:
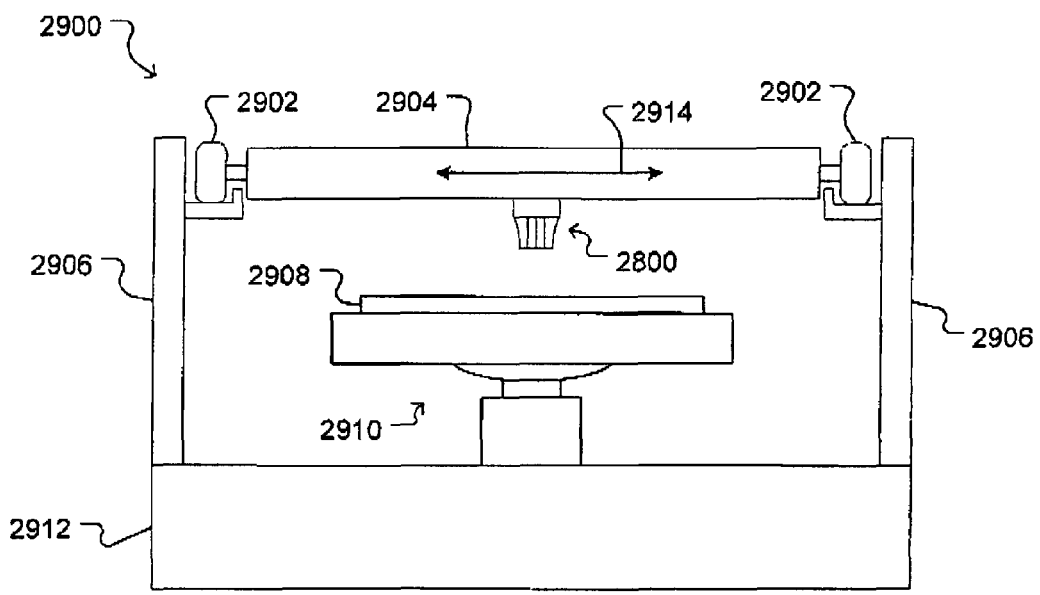
FIG. 29 illustrates a representative system for applying droplets to a substrate in accordance with some embodiments of the invention.

Droplets 2122, 2124, 2126 can be deposited on substrate 2002 in any manner suitable for depositing droplets of different materials in a three-dimensional array like the array formed by layers 2102 in FIGS. 21A and 21B. For example, droppers (not shown) can be used to deposit the droplets 2122, 2124, 2126 in the pattern shown in FIGS. 21A and 218. As another non-limiting example, an automated spray head (not shown) can be used to deposit the droplets 2122, 2124, 2126. For example, an ink jet print head can be used to deposit the droplets 2122, 2124, 2126. A non-limiting example of a suitable spray head is shown in FIG. 28, which reproduces FIG. 21 of pending U.S. patent application Ser. No. 11/306, 291, filed Dec. 21, 2005. FIG. 29, which reproduces FIG. 22 of the foregoing patent application illustrates a system in which such a spray head can be used to deposit droplets like 2122, 2124, 2126 on a substrate like substrate 2002.

FIG. 28 illustrates an exemplary spray head 2800 that can apply droplets onto a substrate in accordance with some embodiments of the invention. In FIG. 28, spray head 2800 can include connectors 2802 that provide one or more materials from one or more corresponding sources (not shown) to body 2804. Individual corresponding droplets can be selectively dispensed from spray head 2800 at dispensers 2806, 2808, 2810, 2812. In some embodiments of the invention, each dispenser 2806, 2808, 2810, 2812 can dispense droplets of a different material. That is, each dispenser 2806, 2808, 2810, 2812 can dispense a different type of droplet.

In FIG. 29, a representative system 2900 for applying droplets to a substrate 2908, is illustrated. In FIG. 29, system 2900 can comprise spray head 2800 that is connected to a control mechanism 2904 that allows for first direction or directions of movement through rollers 2902 and second direction or directions of movement 2914. System 2900 further includes base 2912 and frame 2906 to support control mechanism 2904. Control mechanism 2904 can also move spray head 2800 up and down (with respect to FIG. 29) and can also be configured to impart other movements to spray head 2800, such as tilting or rotating spray head 2800. A chuck 2910 or other holding mechanism can hold substrate 2908, and chuck 2910 can be moveable. By moving one or both of spray head 2800 and/or substrate 2908, droplets can be selectively deposited on substrate 2908 through spray head 2800 in patterns like those shown herein. System 2900 is exemplary only and many variations are possible.

Figure 22A:
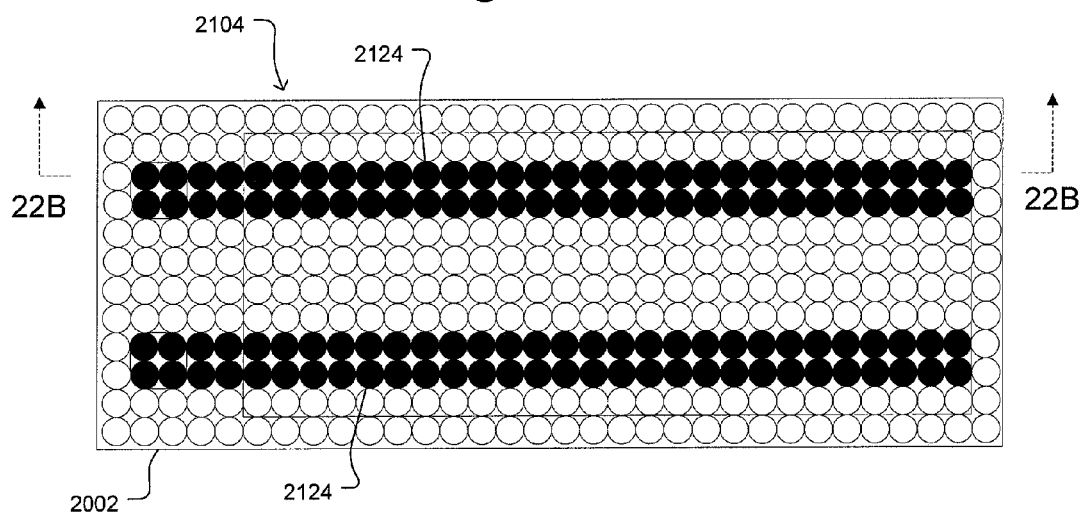
Figure 22B:
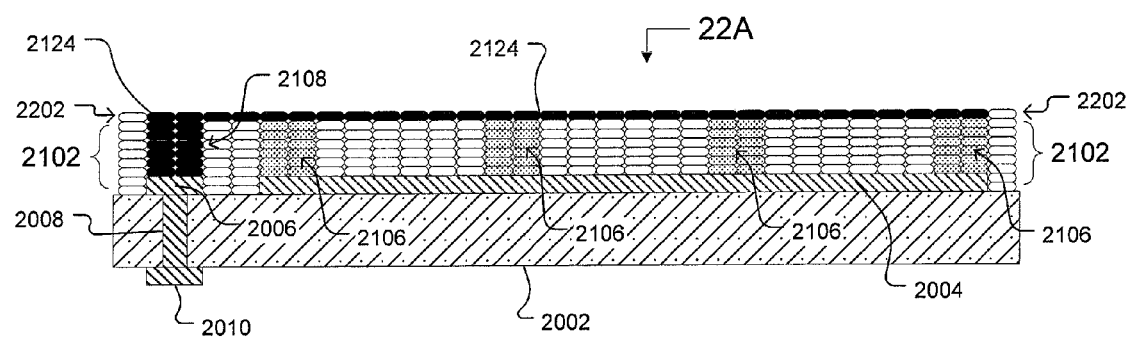

FIGS. 22A and 22B illustrate addition of another layer 2202 of droplets (which can alternatively comprise a plurality of layers of droplets) to the surface 2104 of layers 2102. As shown, the additional layer 2202 includes patterns of electrically conductive droplets 2124. As will be seen, traces (2302 in FIGS. 23A and 23B can be formed on the patterns of the electrically conductive droplets 2124 in the layer 2202. The electrically conductive droplets 2124 in the layer 2202 can therefore be deposited in a pattern that corresponds to the desired shapes of the traces (2302 in FIGS. 23A and 23B) to be formed. As shown in FIGS. 22A and 22B, each pattern of conductive droplets 2124 can be disposed over a plurality of the pylons 2106, 2108.

Figure 23A:
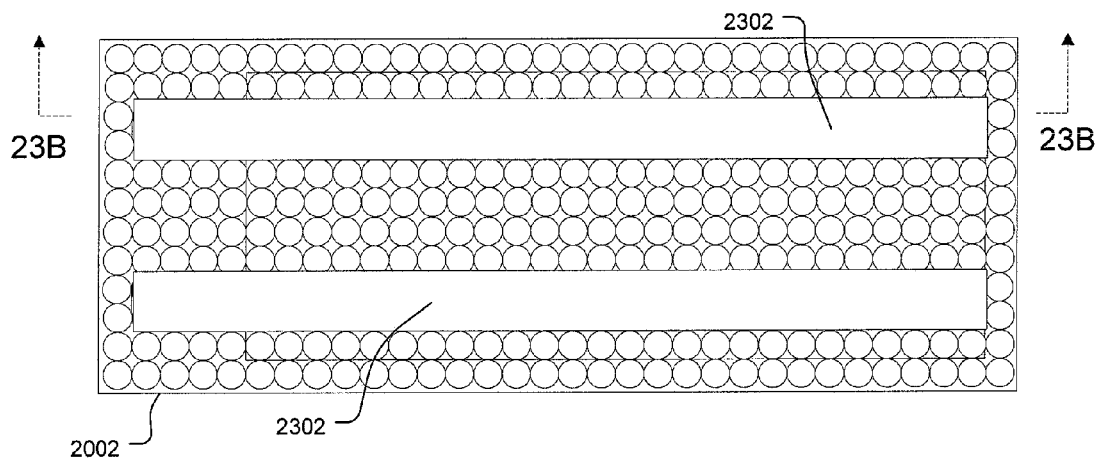
Figure 23B:
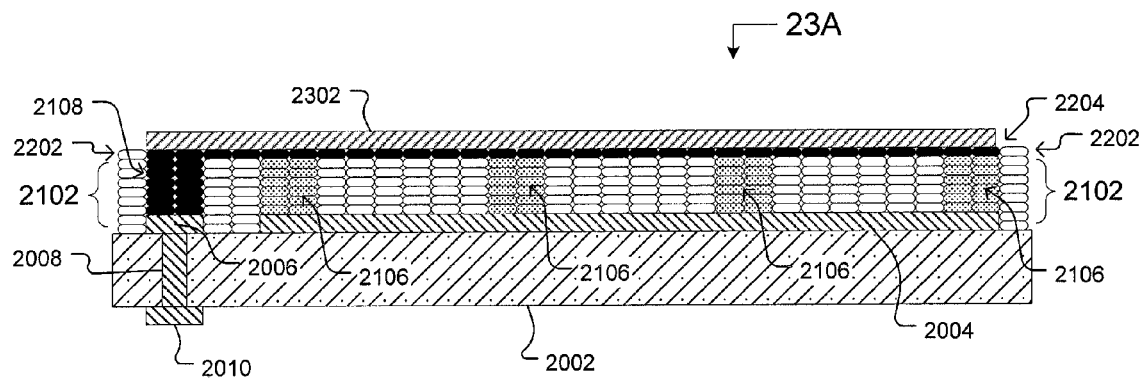

As shown in FIGS. 23A and 23B (FIG. 23A shows a top view, and FIG. 23B shows a side, cross-sectional view), traces 2302 (which can be like traces 112 of FIG. 1, traces 1012 of FIG. 15, or traces 1612 of FIG. 19) can be formed on the surface 2204 of the pattern of conductive droplets 2124 in layer 2202. For example, the pattern of conductive droplets 2124 in layer 2202 can function as a seed layer onto which material forming the traces 2302 can be electroplated as generally discussed above. Alternatively, material forming traces 2302 can be deposited using deposition methods other than electroplating. For example, chemical vapor deposition, physical vapor deposition, sputter deposition, electroless plating, electron beam deposition, evaporation (e.g., thermal evaporation), flame spring coating, plasma spray coating. If a deposition method other than electroplating is used, layer 2202 can be dispensed with, and the material forming traces 2302 can be deposited directly onto the outer layer in layers 2102.

Figure 24A:
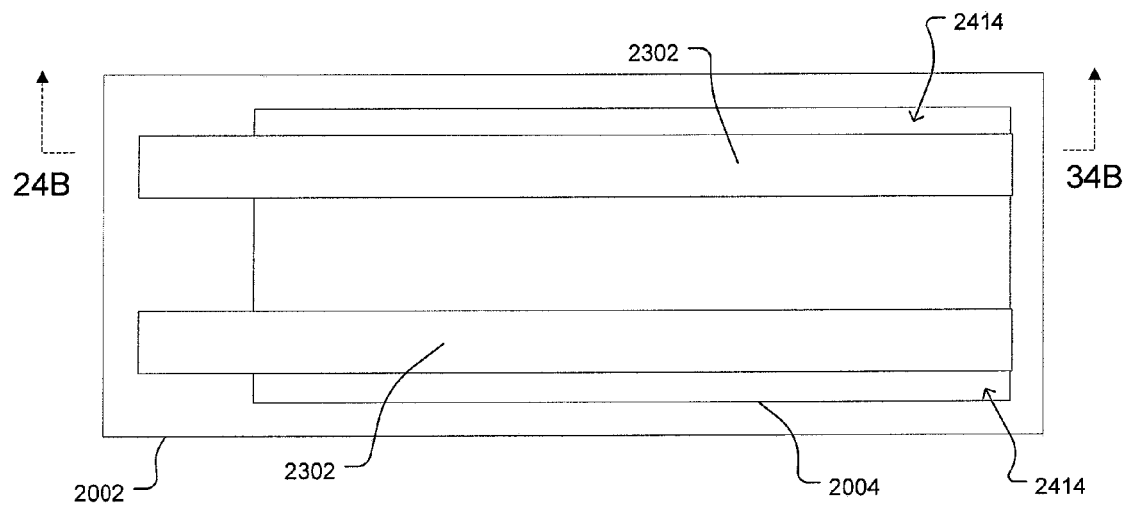
Figure 24B:
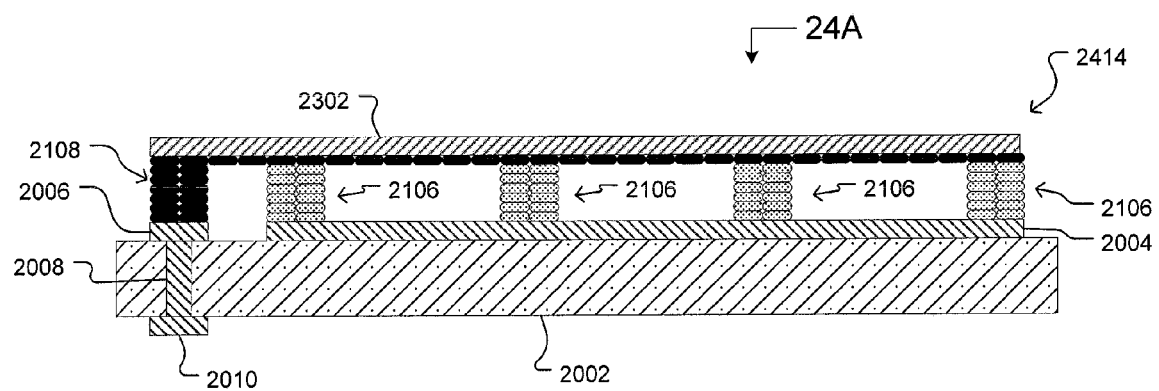

As shown in FIGS. 24A and 24B, (FIG. 24A shows a top view, and FIG. 24B shows a bottom view), the soluble droplets 2122 in the layers 2102, 2202 can be removed by dissolving them with a solvent that dissolves droplets 2122 but does not appreciably dissolve the electrically conductive droplets 2124 or non-conductive droplets 2126. The result can be air bridge structures 2414 comprising traces 2302 disposed on pylons 2106. As discussed above, pylon 2108 can be electrically conductive and can thus electrically connect a trace 2302 to a terminal 2006. Although not shown, a trace 2302 can also be electrically connected to other terminals (not shown) or electrical elements (not shown) on substrate 2002. Pylons 2106 can comprise dielectric material and can dispose the traces 2302 away from the plate 2004.

Air bridge structures 2414 can be generally similar to the air bridge structures 114 of FIG. 1, the air bridge structures 1414 of FIG. 15, and the air bridge structures 1814 of FIG. 19. For example, as in the air bridge structures 114 of FIG. 1, the pylons 1206 can be sized and configured to occupy a selected portion of the area of a trace 2302. Thus, the air bridge structures 2414 can be configured to have the same percentages discussed above with respect to bridge structures 114 of ambient air as the dielectric material between a trace 2302 and the plate 2004.

Many variations of the process shown in FIGS. 20A-24B and the air bridge structures 2414 shown in FIGS. 24A and 24B are possible. For example, the traces 2302 can alternatively be electrically connected to terminals 2006 using wires, like wires 1508 of FIG. 15. In such a case, conductive pylons 2108 need not be included, and the traces 2302 need not extend to terminals 2006. For example, the trace 2302 shown in FIG. 24B can end at the left-most pylon 2106.

Figure 25:
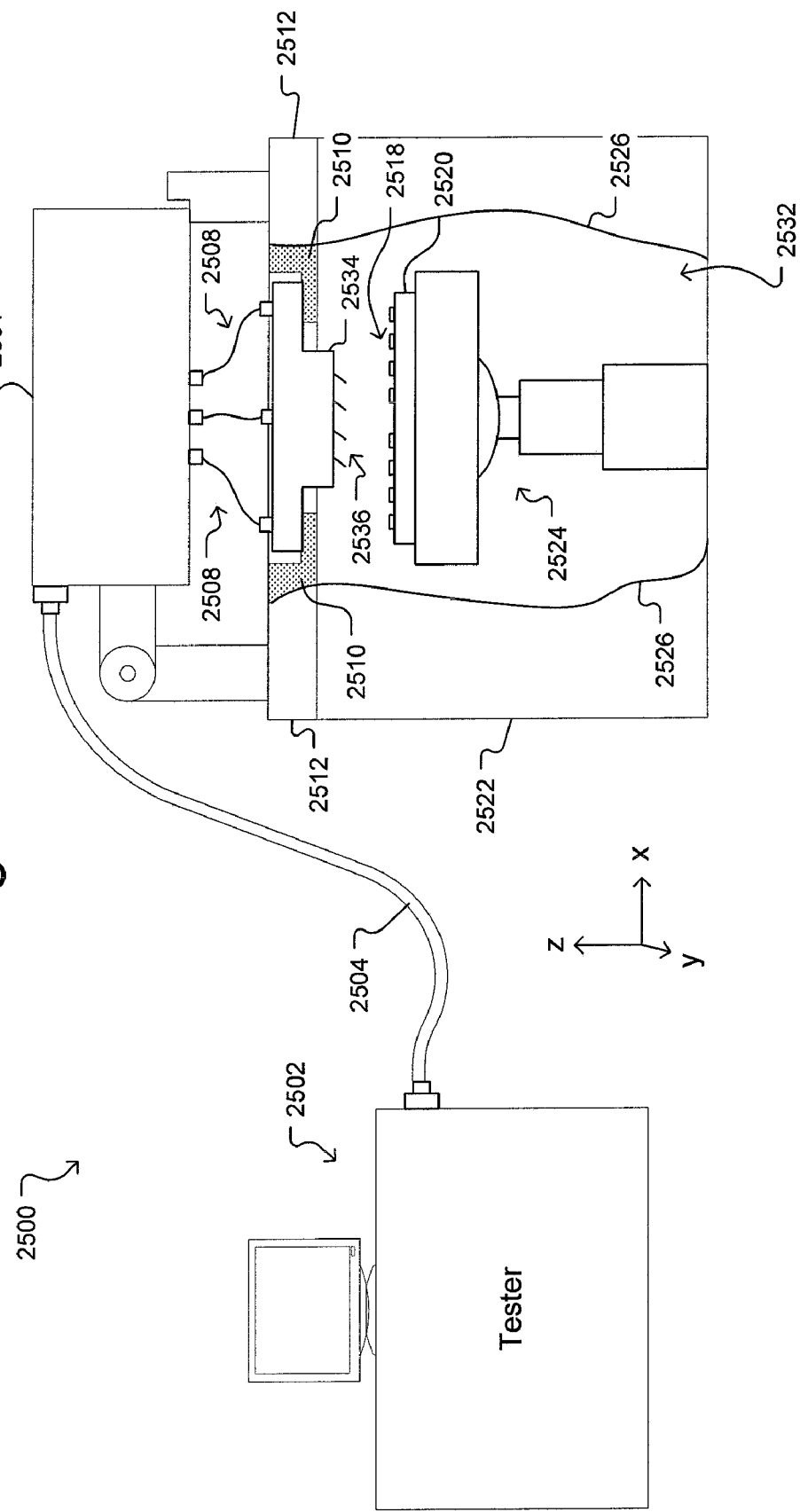
FIG. 25 illustrates an exemplary test system according to some embodiments of the invention.

FIG. 25 illustrates an exemplary test system 2500 for testing electronic devices. One or more electronic devices to be tested (hereinafter referred to as a device under test or "DUT") 2520 can be placed on a moveable stage 2524, which can be moved in the "x," "y," and "z" directions, rotated, and/or tilted. (As used herein, "DUT" can comprise one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, or any other type of electronic device or devices.) The stage 2524 can be located in a prober 2522. A cut-out 2526 is included in FIG. 25 to provide a partial view 2532 inside the prober 2522. As shown, the prober 2522 can include a head plate 2512, which can be a rigid structure comprising an insert ring 2510 to which a probe card assembly 2534 can be bolted or otherwise attached. The stage 2524 can align ones of input and/or output terminals 2518 of the DUT 2520 with electrically conductive probes 2536 of the probe card assembly 2534 and then press those terminals 2518 against the probes 2536, forming temporary electrical connections between the probes 2536 and ones of the terminals 2518 of the DUT 2520.

Probes 2536 can be resilient, conductive structures. Non-limiting examples of suitable probes 2536 include composite structures formed of a core wire bonded to a conductive terminal (not shown) on the probe card assembly 2534 that is over coated with a resilient material as described in U.S. Pat. No. 5,476,211, U.S. Pat. No. 5,917,707, and U.S. Pat. No. 6,336,269. Probes 2536 can alternatively be lithographically formed structures, such as the spring elements disclosed in U.S. Pat. No. 5,994,152, U.S. Pat. No. 6,033,935, U.S. Pat. No. 6,255,126, U.S. Pat. No. 6,945,827, U.S. Patent Application Publication No. 2001/0044225, and U.S. Patent Application Publication No. 2004/0016119. Still other non-limiting examples of probes 2536 are disclosed in U.S. Pat. No. 6,827,584, U.S. Pat. No. 6,640,432, U.S. Pat. No. 6,441,315, and U.S. Patent Application Publication No. 2001/0012739. Other non-limiting examples of probes 2536 include conductive pogo pins, bumps, studs, stamped springs, needles, buckling beams, etc.

Electrical communications paths formed by a communications connector 2504 (which can be a communications cable, a wireless link, or any other means of communicating electrical signals) and a test head 2501 can provide a plurality of communications channels (not shown) between a tester 2502, which can comprise one or more computers, and the probe card assembly 2534. Electrical connectors 2508 can electrically connect the communications channels (not shown) to the probe card assembly 2534, which can provide electrical communications paths (not shown in FIG. 25) from the connectors 2508 to the probes 2536. As will be seen, the communications paths (not shown in FIG. 25) between the connectors 2508 and the probes 2536 can include air bridge structures (not shown in FIG. 25) like any of the air bridge structures disclosed herein.

DUT 2520 can be tested as follows. The tester 2502 can generate test data, which can be provided to input terminals 2518 of the DUT 2520 through the communications channels (not shown) formed by the communications connector 2504 and the test head 2501, connectors 2508, the probe card assembly 2534, and probes 2536 in contact with the input terminals 2518. Response data generated by the DUT 2520 can be sensed by probes 2536 in contact with output terminals 2518 of the DUT 2520 and provided to the tester 2502 through the probe card assembly 2534, connectors 2506, and communications channels formed by the test head 2501 and the communications connector 2504. The tester 2502 can evaluate the response data and determine whether all or part of the DUT 2520 passes or fails the testing. For example, the tester 2502 can determine whether the response data generated by the DUT 2520 or part of the DUT 2520 (e.g., individual electronic devices of the DUT 2520, if the DUT 2520 comprises a plurality of electronic devices) is the same as expected response data. The tester 2502 can alternatively or in addition rate all or part of the DUT 2520.

Figure 26:
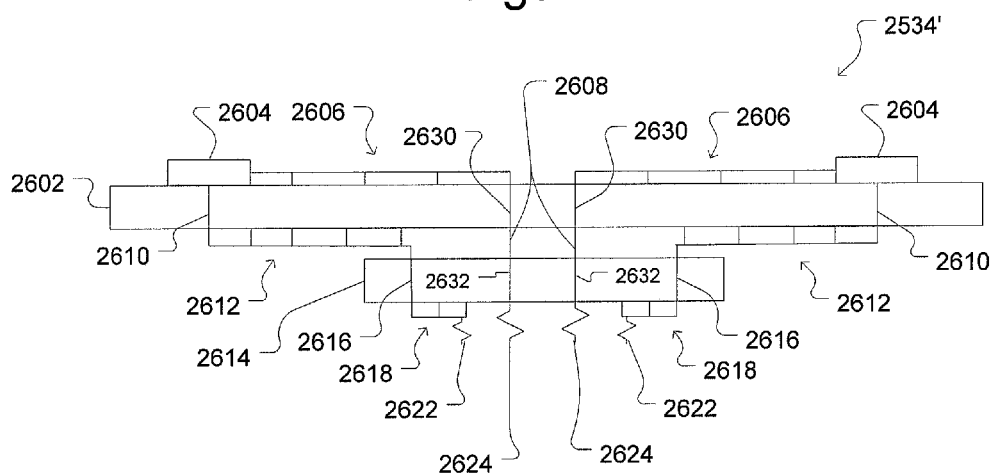
FIG. 26 illustrates an exemplary probe card assembly that includes air bridge structures according to some embodiments of the invention.

FIG. 26 illustrates an exemplary configuration 2534' of the probe card assembly 2534 of FIG. 25 according to some embodiments of the invention. As shown, the probe card assembly 2534' of FIG. 26 can include a wiring substrate 2602 and a probe head assembly 2614. Electrical connectors 2604 configured to make electrical connections with the connectors 2508 to and from the test head 2501 in the test system 2500 of FIG. 25 can be disposed on the wiring substrate 2602. Connectors 2508 can be any mechanism or structure suitable for making electrical connections with connectors 2508 from the test head 2501 of FIG. 25. For example, connectors 2508 can be zero-insertion-force ("ZIF") electrical connectors. As another example, connectors 2508 from the test head 2501 of FIG. 25 can be pogo-pin electrical connectors, and connectors 2604 can be electrically conductive pads. Probes 2622, 2624, which can be like probes 2536 of FIG. 25, can be disposed on the probe head assembly 2614.

As shown in FIG. 26, electrical paths can be provided from the connectors 2604 through the wiring substrate 2602 to the probe head assembly 2614, and some or all of those electrical paths can comprise air bridge structures. For example, as shown in FIG. 26, air bridge structures 2606 (two are shown but more or fewer can be used) can be disposed on a top surface of the wiring substrate 2602 and can provide electrical connections from connectors 2604 to electrical connections 2630 through the wiring substrate 2602, which can be electrically connected by connections 2608 to electrical connections 2632 through the probe head assembly 2614 to ones of the probes 2624 as shown. As also shown in FIG. 26, electrical connections 2610 through the wiring substrate 2602 can electrically connect the connectors 2604 to air bridge structures 2612 (two are shown but more or fewer can be used) on a bottom surface of the wiring substrate 2602, and electrical connections 2616 can connect the air bridge structures 2612 to air bridge structures 2618 on a bottom surface of the probe head assembly 2614. As shown, the air bridge structures 2618 can terminate in a probe 2622. Although not shown, air bridge structures 2618 can also be provided on a top surface of the probe head assembly 2614.

The air bridge structures 2606, 2612, and 2618 can be like any of the air bridge structures 114 of FIG. 1, 1414 of FIG. 15, 1814 of FIG. 19, or 2414 of FIGS. 24A and 24B and can be disposed on conductive plates (not shown in FIG. 26) like any of plates 106 of FIG. 1, 1506 of FIG. 15, or 2004 of FIGS. 24A and 24B, one or more of which can be disposed on the wiring substrate 2602 and the probe head assembly 2614. Electrical connections 2610, 2630 can comprise electrically conductive traces on or within and/or electrically conductive vias through the wiring substrate 2602. Electrical connections 2616, 2632 can similarly comprise electrically conductive traces on or within and/or electrically conductive vias through the probe head assembly 2602. Electrical connections 2608 between the wiring substrate 2602 and the probe head assembly 2614 can comprise any suitable connectors including without limitation electrically conductive wires, spring structures, flex circuits, interposers, etc.

Thus, some or all of the electrical paths between connectors 2604 and probes 2622, 2624 can include one or more air bridge structures like the air bridge structures 114 of FIG. 1, 1414 of FIG. 15, 1814 of FIG. 19, or 2414 of FIGS. 24A and 24B, disposed at least in part on conductive plates (not shown in FIG. 26), like plates 106 of FIG. 1, 1506 of FIG. 15, or 2004 of FIGS. 24A and 24B, on wiring substrate 2602 and probe head assembly 2614. Other electrical paths (not shown) between connectors 2604 and other probes, like probes 2624, on the probe head assembly 2614 can be provided that do not include an air bridge structure. Thus, some or all of the test data generated by the tester 2502 and the response data generated by the DUT 2520 can be provided through the probe card assembly 2534 on air bridge structures like the air bridge structures 114 of FIG. 1, 1414 of FIG. 15, 1814 of FIG. 19, or 2414 of FIGS. 24A and 24B.

The wiring substrate 2602 can be any substrate, combination of substrates, or other structure or structures to which connectors 2604 can be attached and on or through which electrical connections to and from the connectors 2604 can be provided. Thus, the wiring substrate 2602 can be as simple as a printed circuit board material or as complicated as a multi-element structure. The probe head assembly 2614 can likewise be as simple as a substrate on which probes 2624 and air bridge structures 2618 can be disposed and on or through which wiring or other forms of electrical connections can be provided. Alternatively, the probe head assembly 2614 can comprise multiple substrates and mechanisms. For example, the probe head assembly 2614 can comprise a plurality of substrates (not shown), and a subset of the probes 2622, 2624 can be attached to each of the substrates (not shown). The substrates (not shown) can be positioned with respect to each other such that the subsets of probes 2622, 2624 on the substrates (not shown) form a larger array of probes 2622, 2624 for contacting many terminals (e.g., like 2518 of FIG. 25) of a DUT (e.g., like 2520 of FIG. 25) that comprises many different electronic devices. Moreover, those substrates can be independently adjustable. Non-limiting examples of probe card assemblies with multiple probe substrates are disclosed in pending U.S. patent application Ser. No. 11/165,833, filed Jun. 24, 2005. Additional non-limiting examples of probe card assemblies are illustrated in U.S. Pat. No. 5,974,662 and U.S. Pat. No. 6,509,751 and the aforementioned pending U.S. patent application Ser. No. 11/165,833, filed Jun. 24, 2005, and various features of the probe card assemblies described in those patents may be implemented in the probe card assembly 2534'shown in FIG. 26.

The wiring substrate 2602 and the probe head assembly 2614 can be attached to each other in any suitable manner. For example, brackets, clamps, bolts, spring structures, etc. (not shown) can be used to attach the wiring substrate 2602 and the probe head assembly 2614 together. Moreover, adjustment mechanisms (not shown) can be included, including mechanisms (not shown) for adjusting the orientation of tips of the probes 2622, 2624. For example, mechanisms (not shown) can be included for planarizing the tips of the probes 2622, 2624. Non-limiting examples of mechanisms suitable for attaching the wiring substrate 2602 and the probe head assembly 2614 to each other as well as adjustment mechanisms are disclosed in the previously mentioned U.S. Pat. No. 5,974,662 and U.S. Pat. No. 6,509,751 and the aforementioned pending U.S patent application Ser. No. 11/165,833, filed Jun. 24, 2005.

Figure 27:
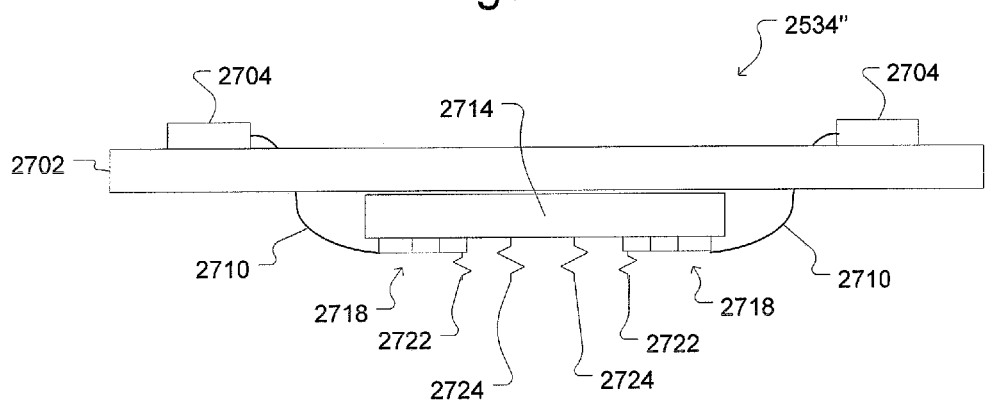
FIG. 27 illustrates another exemplary probe card assembly that includes air bridge structures according to some embodiments of the invention.

FIG. 27 illustrates another exemplary configuration 2534" of the probe card assembly 2534 of FIG. 25 according to some embodiments of the invention. As shown, probe card assembly 2534" can include a wiring substrate 2702 with connectors 2704 and a probe head assembly 2714 with probes 2722, 2724 all of which can be like wiring substrate 2602, connectors 2604, probe head assembly 2614, and probes 2622, 2624 of FIG. 26. As also shown in FIG. 27, flexible electrical connections 2710 can provide electrical connections between connectors 2704 and air bridge structures 2718, which can be like the air bridge structures 114 of FIG. 1, 1414 of FIG. 15, 1814 of FIG. 19, or 2414 of FIGS. 24A and 24B, and can be disposed on conductive plates (not shown in FIG. 27) on probe head assembly 2714, like any of plates 106 of FIG. 1, 1506 of FIG. 15, or 2004 of FIGS. 24A and 24B. The flexible electrical connections 2710 can comprise any electrically conductive structures. For example, the flexible electrical connections 2710 can be a flex circuit, electrical wires, etc. Moreover, each flexible electrical connection 2710 can pass through a hole (not shown) in the wiring substrate 2702. The flexible electrical connections 2710 can thus be provided directly from the connectors 2704 to air bridge structures 2718 and probes 2722. Electrically conductive traces (not shown) on or in and vias (not shown) in the wiring substrate 2714 and the probe head assembly 2714 can provide other electrically conductive paths from the connectors 2704 to other probes 2724.

Air bridge structures, like air bridge structures 114 of FIG. 1, air bridge structures 1414 of FIG. 15, and air bridge structures 1814 of FIG. 19, disposed on one or more conductive plates, like plate plates 106 of FIG. 1, 1506 of FIG. 15, or 2004 of FIGS. 24A and 24B, can be used to carry electrical signals on electronic devices other than a probe card assembly. Indeed, such air bridge structures can be disposed on almost any electronic device. For example, such air bridge structures can be utilized on a semiconductor die (not shown) to convey signals on the die.

Although specific embodiments and applications of the invention have been described in this specification, there is no intention that the invention be limited these exemplary embodiments and applications or to the manner in which the exemplary embodiments and applications operate or are described herein.

What is claimed is:

1. A method of making an air bridge structure trace comprising:
   providing a substrate comprising an electrically conductive plate;
   depositing a plurality of layers of droplets onto the substrate, the droplets comprising:
      droplets of a first material disposed to form a plurality of pylons on the plate, droplets of a second material disposed to fill spaces between the pylons, and
      droplets of a third material disposed to form an electrically conductive outer seed layer;
   electrodepositing a conductive material onto the seed layer; and
   removing the droplets of the second material.

2. The method of claim 1, wherein the seed layer is spaced away from the plate by ones of the pylons and generally parallel to the plate.

3. The method of claim 1, wherein:
   the droplets of the third material are disposed to form a plurality of seed layers each generally parallel to and spaced apart by ones of the pylons from the plate; and
   the electrodepositing comprises electrodepositing the conductive material onto the seed layers.

4. The method of claim 1, wherein:
   the substrate further comprises an electrically conductive terminal; and
   droplets of the third material are disposed to form a pylon on the terminal.

5. The method of claim 1, wherein the first material comprises a dielectric material.

6. The method of claim 1, wherein the removing comprises dissolving the droplets of the second material in a solvent that does not dissolve the first material.

7. The method of claim 6, wherein the solvent comprises water.

8. The method of claim 1, wherein the depositing comprises depositing the droplets through a print head.

9. The method of claim 8, wherein the print head comprises an ink jet print head.

10. The method of claim 1, wherein the conductive material forms a conductive trace spaced away from the plate by the pylons and generally parallel to the plate.

11. The method of claim 10, wherein ones of the pylons disposed between the trace and the plate occupy less than twenty-five percent of a space between the trace and the plate.

* * * * *